(12) United States Patent
Uchida et al.

(10) Patent No.: US 6,829,195 B2
(45) Date of Patent: Dec. 7, 2004

(54) SEMICONDUCTOR MEMORY DEVICE AND INFORMATION PROCESSING SYSTEM

(75) Inventors: Toshiya Uchida, Kawasaki (JP); Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/227,430

(22) Filed: Aug. 26, 2002

(65) Prior Publication Data

US 2003/0002378 A1 Jan. 2, 2003

Related U.S. Application Data

(63) Continuation-in-part of application No. 10/036,470, filed on Jan. 7, 2002.

(30) Foreign Application Priority Data

Mar. 22, 2001 (JP) ........................................ 2001-081898
Aug. 31, 2001 (JP) ........................................ 2001-263029
Mar. 20, 2002 (JP) ........................................ 2002-077608

(51) Int. Cl.[7] ................................................ G11C 8/00
(52) U.S. Cl. ........................... 365/230.03; 365/189.01; 365/189.12
(58) Field of Search ....................... 365/230.03, 189.12, 365/189.01, 189.07, 189.05, 230.08

(56) References Cited

U.S. PATENT DOCUMENTS

| | | | |
|---|---|---|---|
| 5,774,409 A | 6/1998 | Yamazaki et al. | |
| 5,828,606 A | * 10/1998 | Mick | ..................... 365/189.05 |
| 6,154,417 A | 11/2000 | Kim | |
| 2003/0002378 A1 | 1/2003 | Uchida et al. | |

* cited by examiner

*Primary Examiner*—David Lam
(74) *Attorney, Agent, or Firm*—Arent Fox, PLLC

(57) ABSTRACT

A semiconductor memory device capable of shortening the command supply interval during random access and thus improving the transfer rate of input/output data. In response to a write command, identical data is written into multiple memory banks having identical addresses assigned thereto. At this time, a bank selection circuit sequentially selects the memory banks to initiate write operations in a staggered manner. Since the write operation can be started before all memory banks become idle, the interval between the supply of read command and the supply of write command can be shortened. Consequently, the number of commands supplied per given time can be increased, and since data signal can be input/output more frequently than in conventional devices, the data transfer rate (data bus occupancy) improves. As a result, the performance of a system to which the semiconductor memory device is mounted can be enhanced.

15 Claims, 26 Drawing Sheets

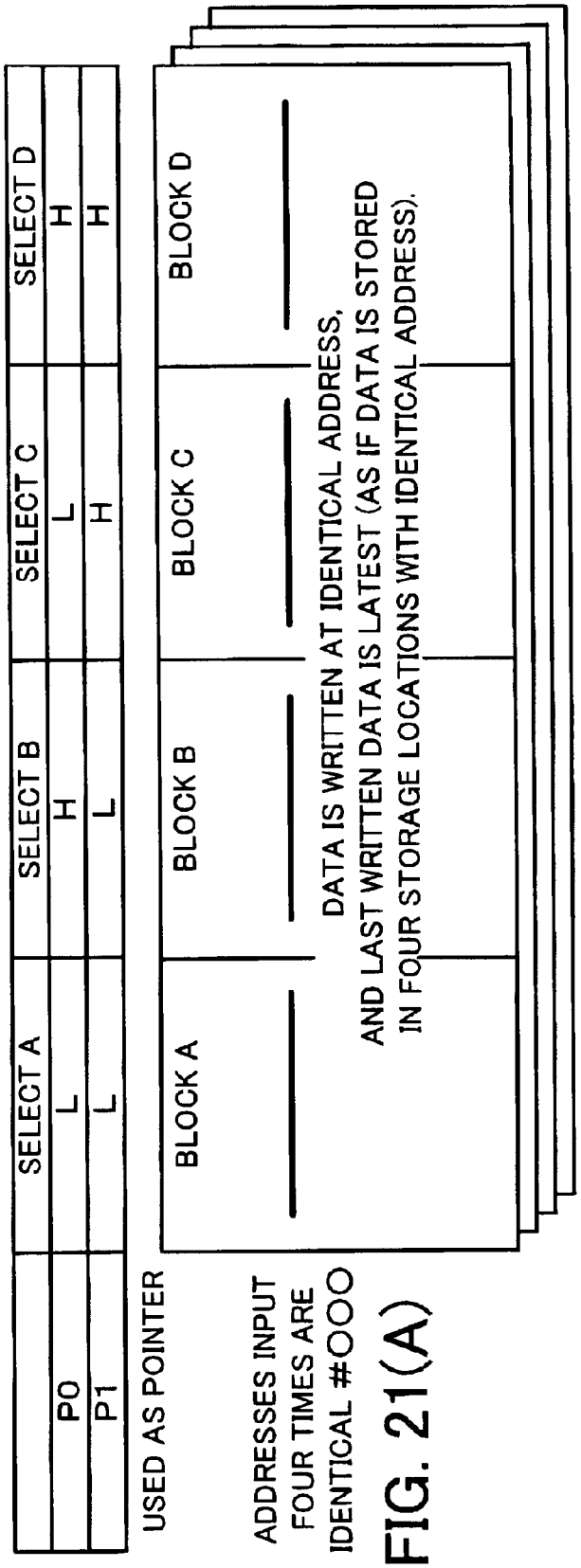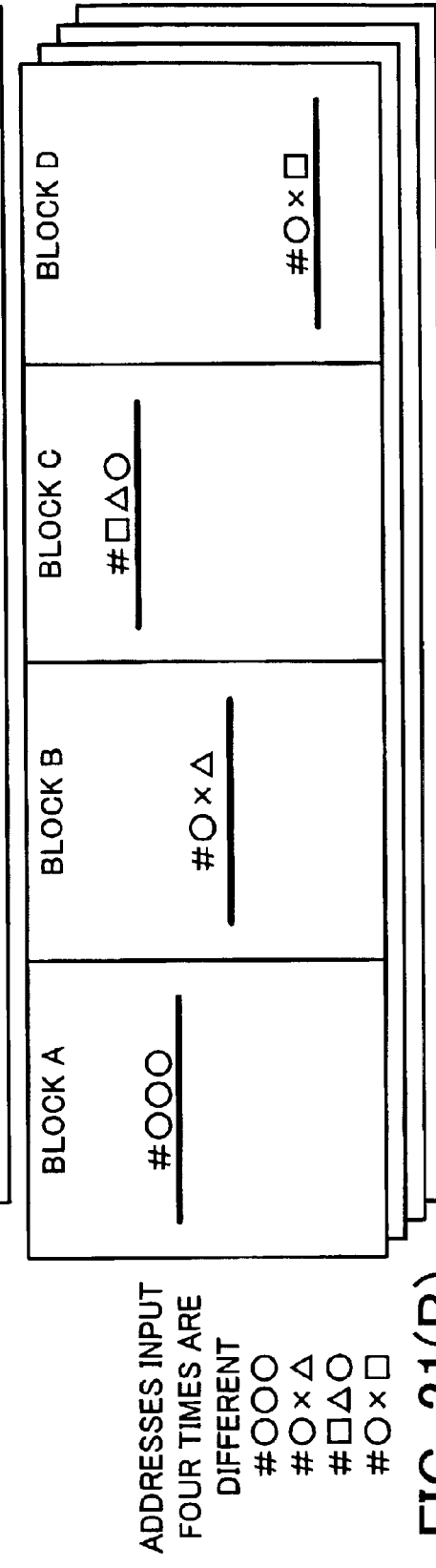
FIG. 21(A)
FIG. 21(B)

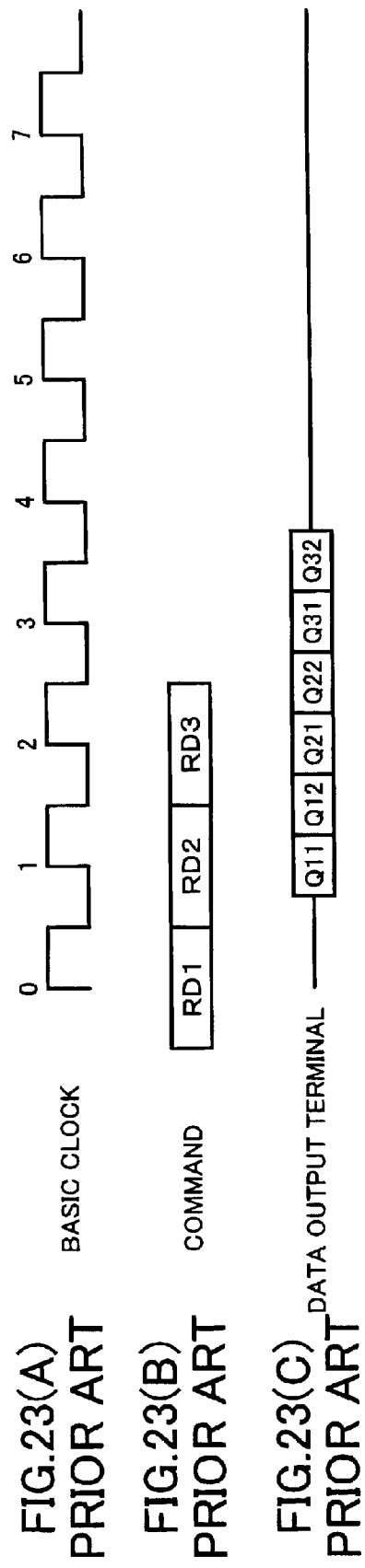

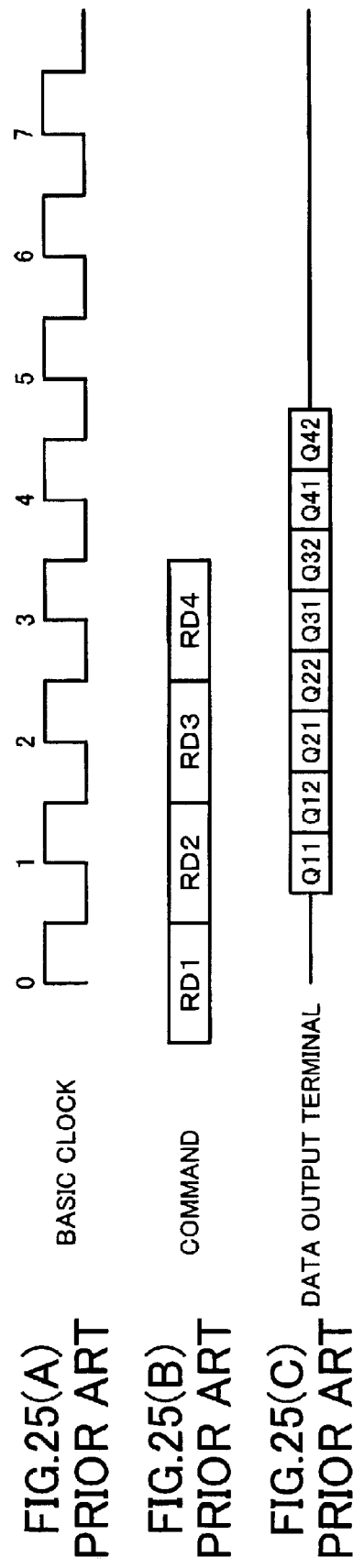

SEMICONDUCTOR MEMORY DEVICE AND INFORMATION PROCESSING SYSTEM

This Application is a continuation-in-part of Ser. No. 10/036,470 file on Jan. 7, 2002

BACKGROUND OF THE INVENTION (1) Field of the Invention

The present invention relates to a semiconductor memory device and an information processing system, and more particularly, to techniques of shortening the operation cycle time of a semiconductor memory device and an information processing system.

(2) Description of the Related Art

A semiconductor memory device and a control device for controlling the memory device exchange data with each other in blocks of bits whose number is determined, for example, by an application such as an OS (Operating System).

In the case of an application wherein the number of bits transferred as one block is small, increase in the quantity of read/write data entails a correspondingly large number of command entries. Accordingly, auto-precharge type DRAM (Dynamic Random Access Memory) which performs read operation and precharge operation at the same time in response to a single entry of command, SRAM (Static RAM) which requires no precharge operation, etc. are useful for the purpose.

This will be explained with reference to FIGS. 22 and 23.

FIGS. 22(A), 22(B) and 22(C) illustrate the operation of a DRAM with no auto-precharge function, that is, a non-auto-precharge type DRAM wherein the number of data bits read out at a time is two. In the case of the non-auto-precharge type DRAM, a precharge command (PRE1–PRE3) needs to be entered following the access in order to execute precharge operation, as shown in FIG. 22(B). In the illustrated example, read commands (RD1–RD3) are input respectively at the leading edges of the zeroth, second and fourth basic clock pulses (FIG. 22(A)), and precharge commands (PRE1–PRE3) are input respectively at the leading edges of the first, third and fifth clock pulses. As a result of the entry of the read commands, 2-bit blocks of data (Q11, Q12; Q21, Q22; Q31, Q32) are output from a DATA output terminal at the leading edges of the first, third and fifth clock pulses, respectively, as shown in FIG. 22(C).

FIGS. 23(A), 23(B) and 23(C) illustrate the operation of an auto-precharge type DRAM capable of automatic precharge operation wherein the number of data bits read out at a time is two. As shown in the figures, in the case of the auto-precharge type DRAM, no precharge command needs to be entered, so that the read commands (RD1–RD3) can be continuously input, as seen from FIG. 23(B). Also, since the interval between commands can be shortened, the interval between data (Q11, Q12, Q21, Q22, Q31, Q32) output from the DATA output terminal is shorter than in the case of FIG. 22, as seen from FIG. 23(C). Compared with the case shown in FIG. 22, therefore, all data can be read out in a shorter period of time.

As explained above, where the number of data bits exchanged between the semiconductor memory device and the control device therefor is small, a device capable of automatic precharge operation, like the auto-precharge type DRAM, is useful because it ensures relatively high density of commands and as a consequence, higher data access density.

The foregoing explains the case where the number of data bits exchanged between the semiconductor memory device and the control device therefor is small; in the following will be considered a case where the number of bits is large.

FIGS. 24(A), 24(B) and 24(C) illustrate the operation of an auto-precharge type DRAM wherein the number of data bits exchanged with the control device is eight. In the illustrated example, a read command RD1 (FIG. 24(B)) is input at the leading edge of the zeroth basic clock pulse shown in FIG. 24(A), and as a result, readout data is output from the DATA output terminal, as shown in FIG. 24(C).

FIGS. 25(A), 25(B) and 25(C) illustrate the operation of an auto-precharge type DRAM wherein the number of data bits exchanged with the control device is eight and the number of data bits read out at a time is two.

As shown in the figures, in the case where a DRAM from which two bits of data can be read out at a time is applied to a system in which the number of data bits exchanged with the control device is eight, four RD commands (RD1–RD4) need to be input. Since, as a result, the interval between the RD commands becomes shorter, an inconvenience arises in that during the access other devices are unable to access the DRAM.

There have also been proposed semiconductor memory devices in Unexamined Japanese Patent Publications (KOKAI) Nos. 2-94194 and 7-192458, wherein at the time of write operation, identical data is written into a plurality of memory banks and at the time of read operation, data is sequentially read out from different memory banks, to thereby shorten the random access time during the read operation.

FIG. 26 illustrates the operation of a clock synchronization type, among semiconductor memory devices of this type. The semiconductor memory device has four memory banks BANK0 to BANK3 for holding identical data. FIG. 26 exemplifies a case where a write cycle intervenes between read cycles.

Read commands RD1 to RD6 are sequentially supplied in synchronism with a clock signal CLK ((a) in FIG. 26). In response to the read commands RD1 to RD6, the four memory banks BANK0 to BANK3 operate in turn ((b) in FIG. 26), so that readout data Q1 to Q6 are output in succession ((c) in FIG. 26). In the illustrated example, the read operation period of each of the memory banks BANK0 to BANK3 is four clock cycles, but since the memory banks BANK0 to BANK3 operate in parallel, the read cycle corresponds to one clock cycle.

Following the read command RD6, a write command WR7 is supplied ((d) in FIG. 26). In response to the write command WR7, all of the memory banks BANK0 to BANK3 perform write operation at the same time. Accordingly, the write command WR7 is supplied after all of the memory banks BANK0 to BANK3 have become idle. In the illustrated example, the write command WR7 needs to be supplied after completion of the operation of the memory bank BANK1. Consequently, a READ-WRITE interval (timing specification) from the supply of the read command RD6 to the supply of the write command WR7 is four clock cycles equal to the operation period of the memory bank BANK1.

In response to the write command WR7, the four memory banks BANK0 to BANK3 perform the write operation at the same time, and as a result, identical write data D7 is written into the memory banks BANK0 to BANK3 ((e) in FIG. 26). Since the identical write data D7 is written in the four memory banks BANK0 to BANK3 at the same time, the write cycle is equal to four clock cycles corresponding to the write operation period of the memory banks BANK0 to BANK3.

Subsequently, read commands RD8 to RD11 are sequentially supplied ((f) in FIG. 26). The four memory banks BANK0 to BANK3 operate in turn ((g) in FIG. 26) and readout data Q8 to Q11 are output in succession ((h) in FIG. 26) in the same manner as described above.

Conventionally, an optimum device must be selected in accordance with the number of data bits exchanged between the semiconductor memory device and the control device therefor, as seen from FIGS. 22 to 25. In other words, there was no conventional device that can cope with all probable numbers of bits.

Also, as shown in FIG. 26, all of the memory banks BANK0 to BANK3 perform write operation at the same time. Accordingly, in cases where a write cycle intervenes between read cycles, the write command WR7 needs to be supplied after the read operations of all memory banks BANK0 to BANK3 are completed. As a result, the supply of the write command WR7 must be deferred for four clock cycles after the supply of the read command RD6. Further, the interval (READ-READ command interval) required from the read command RD6 to the next read command RD8 corresponds to the sum of the operation period of the memory bank BANK1 which is the last to perform the read operation and the write operation period.

As a consequence, especially in cases where read cycles and write cycles take place randomly, a problem arises in that the data transfer rate (data bus occupancy) lowers.

SUMMARY OF THE INVENTION

The present invention was created in view of the above circumstances, and an object thereof is to provide a semiconductor memory device which enables optimum operation regardless of the number of data bits exchanged with a control device for controlling the semiconductor memory device, and an information processing system including such a semiconductor memory device.

Another object of the present invention is to shorten the operation cycle time of the semiconductor memory device, in particular, to shorten a command supply interval during random access, thereby enhancing the transfer rate of input/output data.

To achieve the above objects, there is provided an information processing system including a semiconductor memory device having n (n>1) banks, and a control device for controlling the semiconductor memory device. The semiconductor memory device comprises an address input circuit for receiving an input address, a readout circuit for sequentially reading, from (m≦n) banks, data corresponding to one address input via the address input circuit, and a data output circuit for outputting the data read by the readout circuit from the m banks to outside as collective data. The control device comprises a control circuit for controlling the semiconductor memory device in accordance with a cycle time determined by a read cycle of the readout circuit, and an access inhibit circuit for inhibiting access to the predetermined bank in accordance with the bank from which data is being read by the readout circuit.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 21(A), 21(B) is a diagram illustrating the relationship between the address signal P0, P1 and the blocks according to the fifth embodiment;

FIGS. 23(A), 23(B) and 23(C) are a timing chart illustrating an operation of another conventional semiconductor memory device;

FIGS. 25(A), 25(B) and 25(C) are a timing chart illustrating an operation of yet another conventional semiconductor memory device.

DESCRIPTION OF THE PREFERRED EMBODIMENTS

Figure 1:
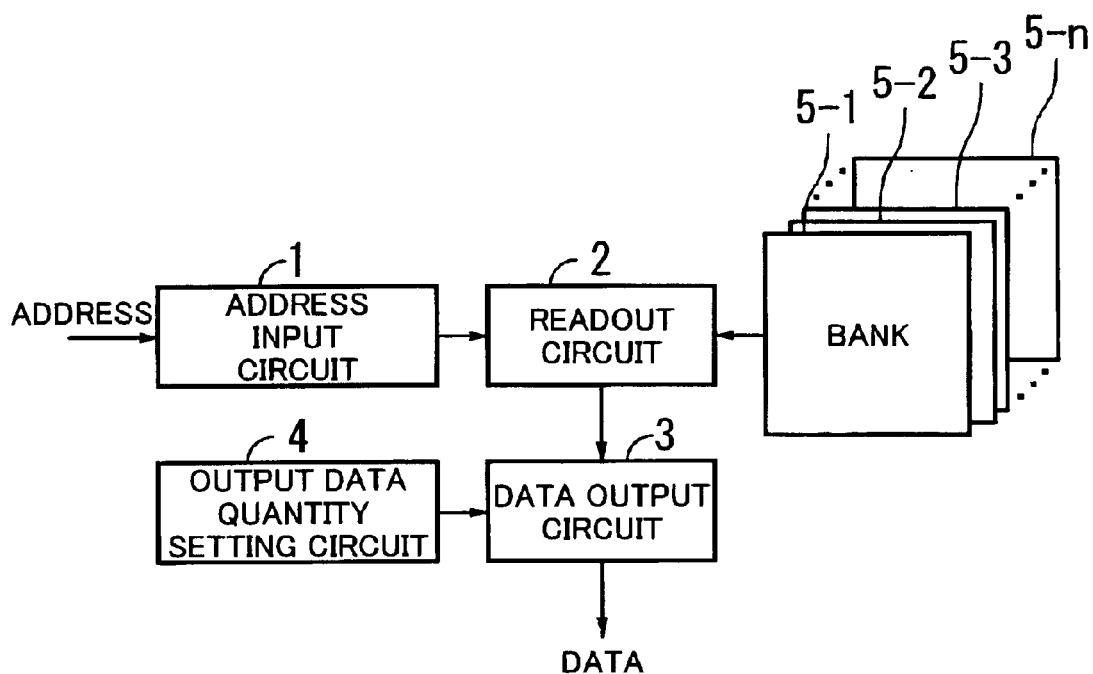
FIG. 1 is a diagram illustrating the principle of operation according to the present invention.

Embodiments of the present invention will be hereinafter described with reference to the drawings. FIG. 1 illustrates the principle of operation according to the present invention. As shown in the figure, a semiconductor memory device according to the present invention comprises an address input circuit 1, a readout circuit 2, a data output circuit 3, an output data quantity setting circuit 4, and banks 5-1 to 5-n.

The address input circuit 1 receives an address input thereto for access from outside.

The readout circuit 2 sequentially reads, from m ($\leq$n) banks, data corresponding to one address input via the address input circuit 1.

The data output circuit 3 outputs the data read by the readout circuit 2 from the m banks to outside as collective data.

The output data quantity setting circuit 4 sets the quantity of data to be output from the data output circuit 3.

Operation in accordance with the illustrated principle will be now described.

At the start of operation of the semiconductor memory device, for example, the output data quantity setting circuit 4 receives, as a control signal from a control device, not shown, information for specifying a quantity of data to be output from the data output circuit 3 as collective data, and sets the output data quantity in accordance with the received information.

With the data quantity to be output from the data output circuit 3 as collective data set in this manner, an address is input to the address input circuit 1 from outside, whereupon the address input circuit 1 supplies the input address to the readout circuit 2.

If the data quantity set by the output data quantity setting circuit 4 is larger than a quantity of data that can be read at a time from a single bank, the readout circuit 2 first selects a bank corresponding to the address input from the address input circuit 1, then reads data from the selected bank and outputs the data to the data output circuit 3. Subsequently, the readout circuit 2 performs bank switching and acquires other data from the same address of a different bank newly switched to. Operation like this is repeated until the quantity of readout data reaches the output data quantity specified by the output data quantity setting circuit 4. In this case, the readout circuit 2 reads data from the banks at predetermined intervals of time so that the data read from different banks may not be congested.

The data output circuit 3 sequentially acquires the data read by the readout circuit 2 from the banks 5-1 to 5-n, and outputs the data successively to outside.

Thus, if the data quantity to be output from the data output circuit 3 as collective data is equal to or smaller than the quantity of data that can be read at a time from a single bank, the readout circuit 2 reads data from one bank and then terminates the read operation; on the other hand, if the former is larger than the latter, the readout circuit 2 sequentially reads, from different banks, data corresponding to one address supplied from the address input circuit 1 while automatically switching the banks 5-1 to 5-n.

Consequently, the quantity of data read out by a single addressing can be varied in accordance with the quantity of data (collective data) which is exchanged with the control device and which is determined by an application in use, making it possible to provide a semiconductor memory device which serves a diversity of uses.

Figure 2:
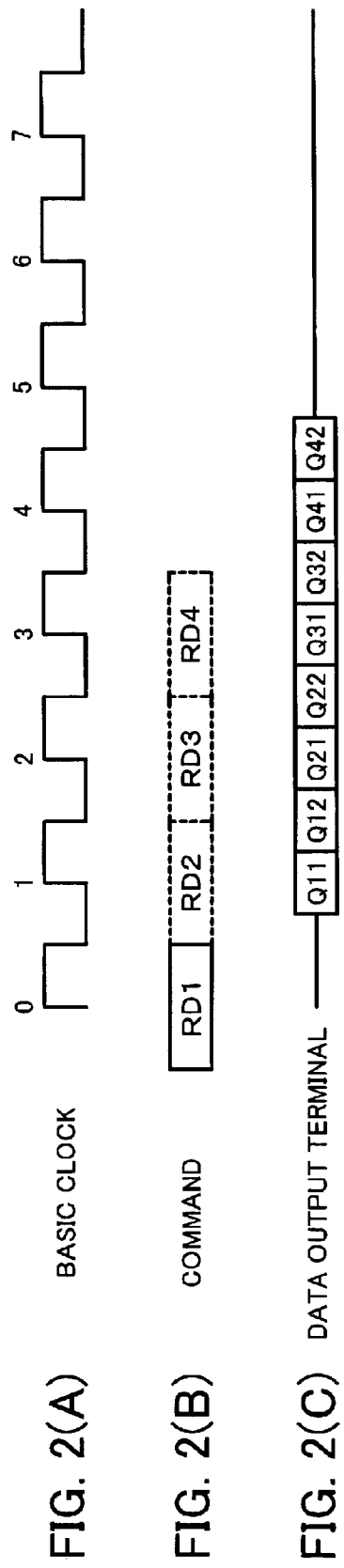
FIGS. 2(A), 2(B) and 2(C) are a timing chart outlining the operation in accordance with the principle illustrated in FIG. 1.

FIGS. 2(A), 2(B) and 2(C) illustrate an example of operation in the case where the number of banks is four (n=4), the number of data bits read from a single bank at a time is two, and the number of data bits output from the data output circuit 3 as collective data is set to eight.

In the illustrated example, a read command RD1 is input in synchronism with the leading edge of the zeroth basic clock pulse shown in FIG. 2(A). In this case, since the number of data bits read from a single bank at a time is two, the readout circuit 2 switches the four banks in turn, sequentially reads, from the individual banks, data corresponding to one address input from the address input circuit 1, and supplies the readout data to the data output circuit 3. The data output circuit 3 outputs the data (Q11, Q12, . . . , Q41, Q42), which the circuit 3 has received separately over four times from the readout circuit 2, to outside as collective data, as shown in FIG. 2(C).

Thus, compared with the conventional semiconductor memory device in which the read command needs to be input four times as indicated by the broken lines in FIG. 2(B), a single entry of read command suffices.

In the above example, the readout circuit 2 makes reference to the data output circuit 3 to detect the data quantity set by the output data quantity setting circuit 4, but the readout circuit may alternatively detect the set data quantity by directly referring to the output data quantity setting circuit 4.

An embodiment of the present invention will be now described.

Figure 3:
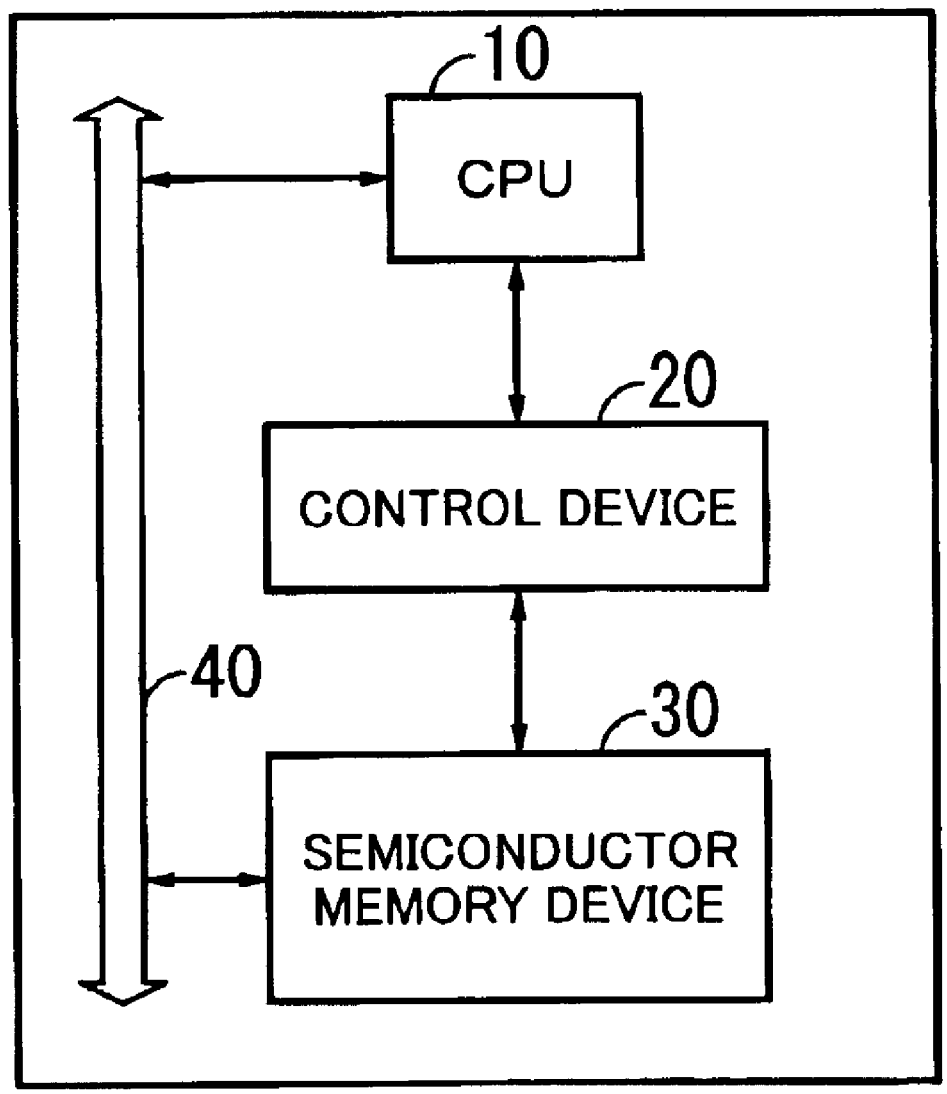
FIG. 3 is a diagram showing an exemplary configuration according to an embodiment of the present invention.

FIG. 3 shows an exemplary configuration of an information processing system according to the embodiment of the present invention, which embodiment corresponds to claims 1 to 4. As shown in the figure, the information processing system of the present invention comprises a CPU (Central Processing Unit) 10, a control device 20, a semiconductor memory device 30, and a bus 40.

The CPU 10 executes various programs etc. stored in the semiconductor memory device 30, to control the individual parts of the system and to perform various operations.

The control device 20 performs control operation relating to the burst length setting, refreshing, etc. of the semiconductor memory device 30.

The semiconductor memory device 30 operates under the control of the control device 20 to store data supplied from the CPU 10 and to supply the stored data read out therefrom to the CPU 10.

The bus 40 transmits data from the CPU 10 to the semiconductor memory device 30 and vice versa.

Figure 4:
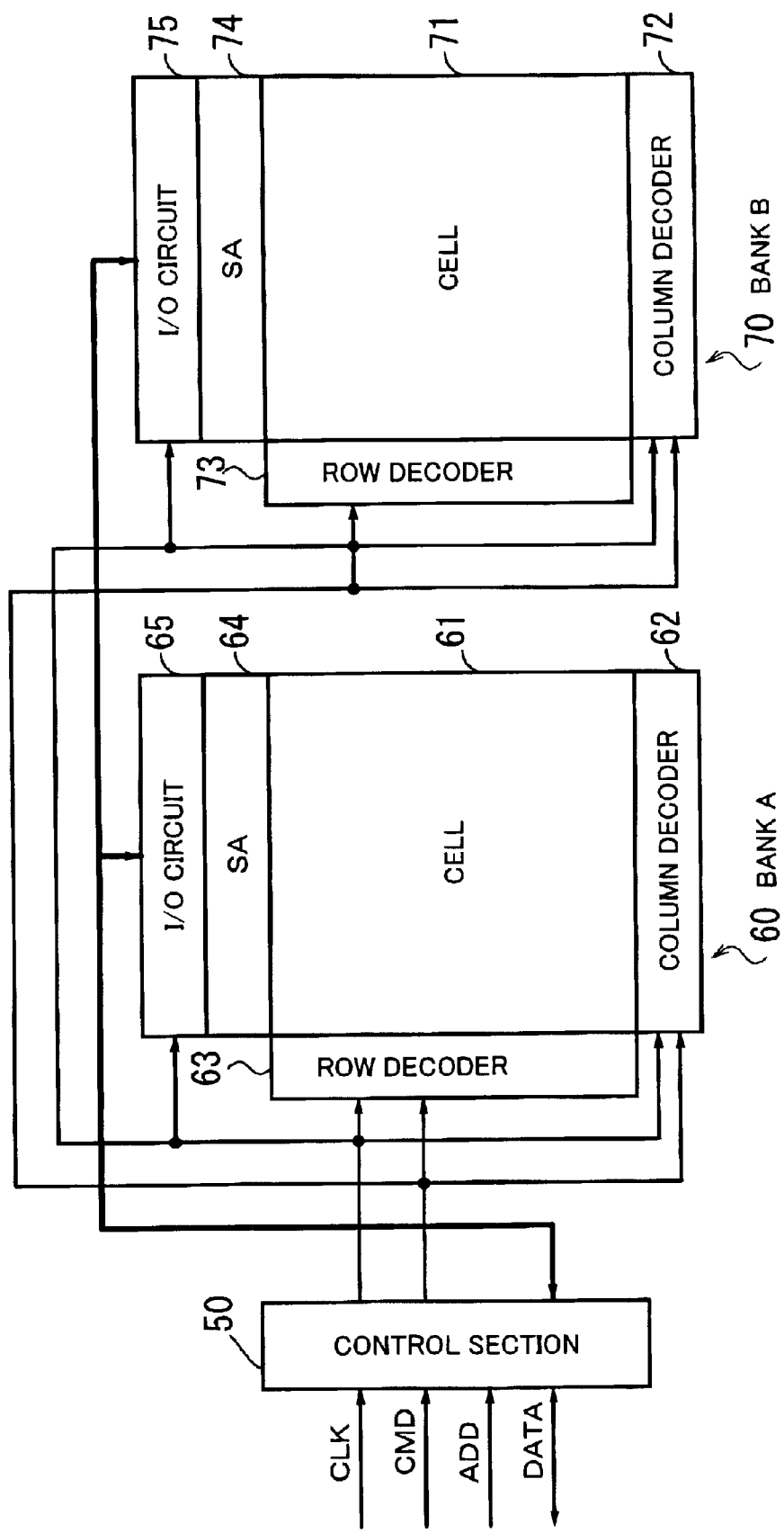
FIG. 4 is a diagram showing in detail an exemplary configuration of a semiconductor memory device appearing in FIG. 3.

FIG. 4 shows in detail an exemplary configuration of the semiconductor memory device 30 appearing in FIG. 3. As shown in the figure, the semiconductor memory device 30 comprises a control section 50, a bank A 60, and a bank B 70. The bank A 60 is constituted by a cell 61, a column decoder 62, a row decoder 63, an SA (Sense Amplifier) 64, and an I/O (Input/Output) circuit 65. Similarly, the bank B 70 is constituted by a cell 71, a column decoder 72, a row decoder 73, an SA 74, and an I/O circuit 75.

The control section 50 is input with a CLK signal, CMD signal, ADD signal, DATA signal, etc. and supplies the signals to the respective parts of the device. Also, when transferring data, the control section selects a predetermined bank to read or write data from or into the selected bank.

The cell 61 of the bank A 60 comprises a group of memory elements arranged in matrix form and stores input data.

The row decoder 63 specifies a certain row of the cell 61 in accordance with a row address when inputting/outputting data.

The column decoder 62 specifies a certain column of the cell 61 in accordance with a column address when inputting/outputting data.

The SA 64 amplifies a signal read from the cell 61 with a predetermined gain, to convert the signal level to a digital signal level.

The I/O circuit 65 performs control operation relating to the input/output of data.

The bank B 70 is configured in the same manner, and therefore, description thereof is omitted.

Figure 5:
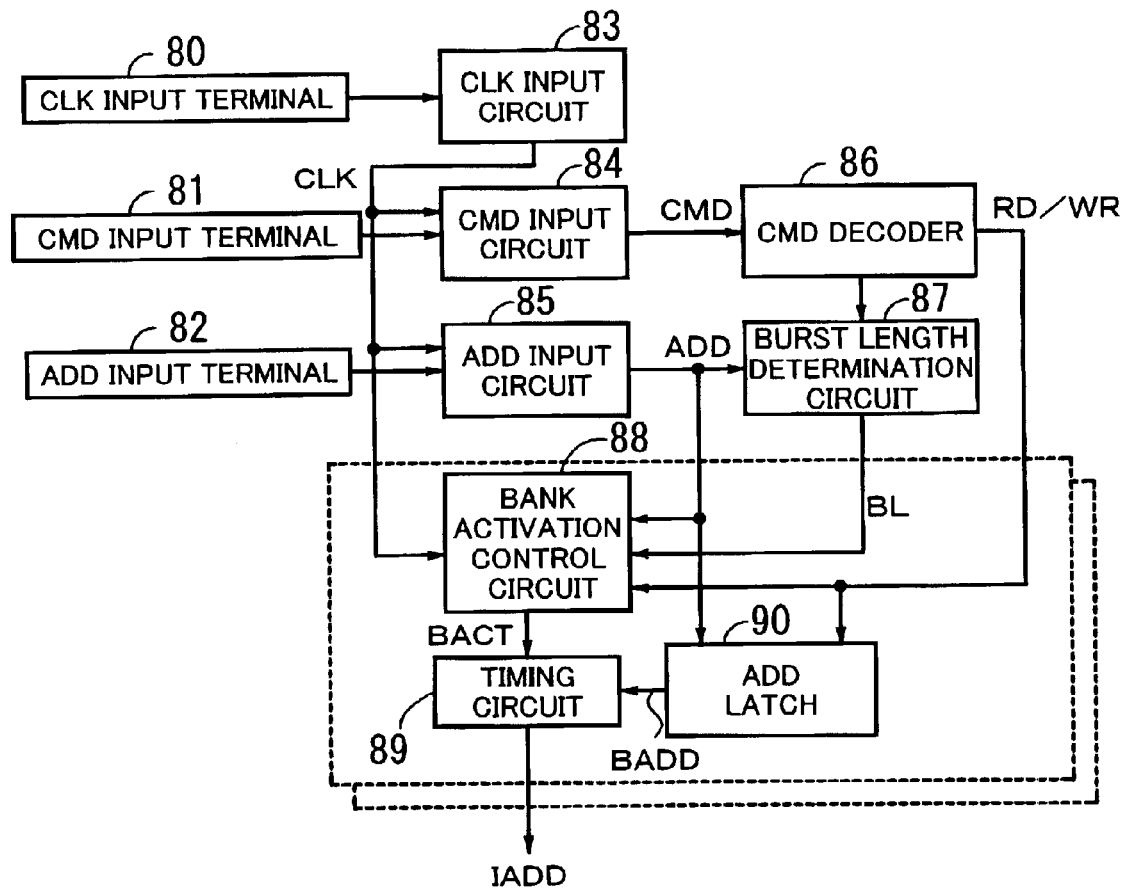
FIG. 5 is a diagram showing in detail an exemplary configuration of a control section appearing in FIG. 4.

FIG. 5 shows in detail an exemplary configuration of the control section 50 appearing in FIG. 4.

A CLK input terminal 80 is input with the CLK signal from outside. A CMD input terminal 81 is input with the CMD signal from outside, and an ADD input terminal 82 is input with the ADD signal from outside.

A CLK input circuit 83 shapes the waveform of the CLK signal input from the CLK input terminal 80, and then supplies the shaped CLK signal to a CMD input circuit 84, an ADD input circuit 85 and a bank activation control circuit 88.

The CMD input circuit 84 shapes the waveform of the CMD signal input from the CMD input terminal 81, and then supplies the shaped CMD signal to a CMD decoder 86.

The ADD input circuit 85 shapes the waveform of the ADD signal input from the ADD input terminal 82, and then supplies the shaped ADD signal to a burst length determination circuit 87.

The CMD decoder 86 decodes the CMD signal supplied from the CMD input circuit 84, and supplies the obtained RD or WR command to the bank activation control circuit 88 and an ADD latch 90.

At the start of operation of the device, for example, the burst length determination circuit 87 is supplied with a command to set the burst length, whereupon the circuit 87 analyzes the command to determine the burst length requested to be set, and notifies the bank activation control circuit 88 of the determined burst length.

The bank activation control circuit 88, a timing circuit 89 and the ADD latch 90, which are provided for each of the banks A 60 and B 70 shown in FIG. 4, supply an internal address IADD to the bank associated therewith and control the data read operation.

The bank activation control circuit 88 controls the timing circuit 89 in accordance with the set burst length, to control the operation of reading data from the corresponding bank.

The ADD latch 90 latches the ADD signal output from the ADD input circuit 85, in synchronism with the RD command output from the CMD decoder 86.

The timing circuit 89 supplies the ADD signal latched by the ADD latch 90, to the corresponding bank as the internal address IADD at the timing as controlled by the bank activation control circuit 88.

Figure 6:
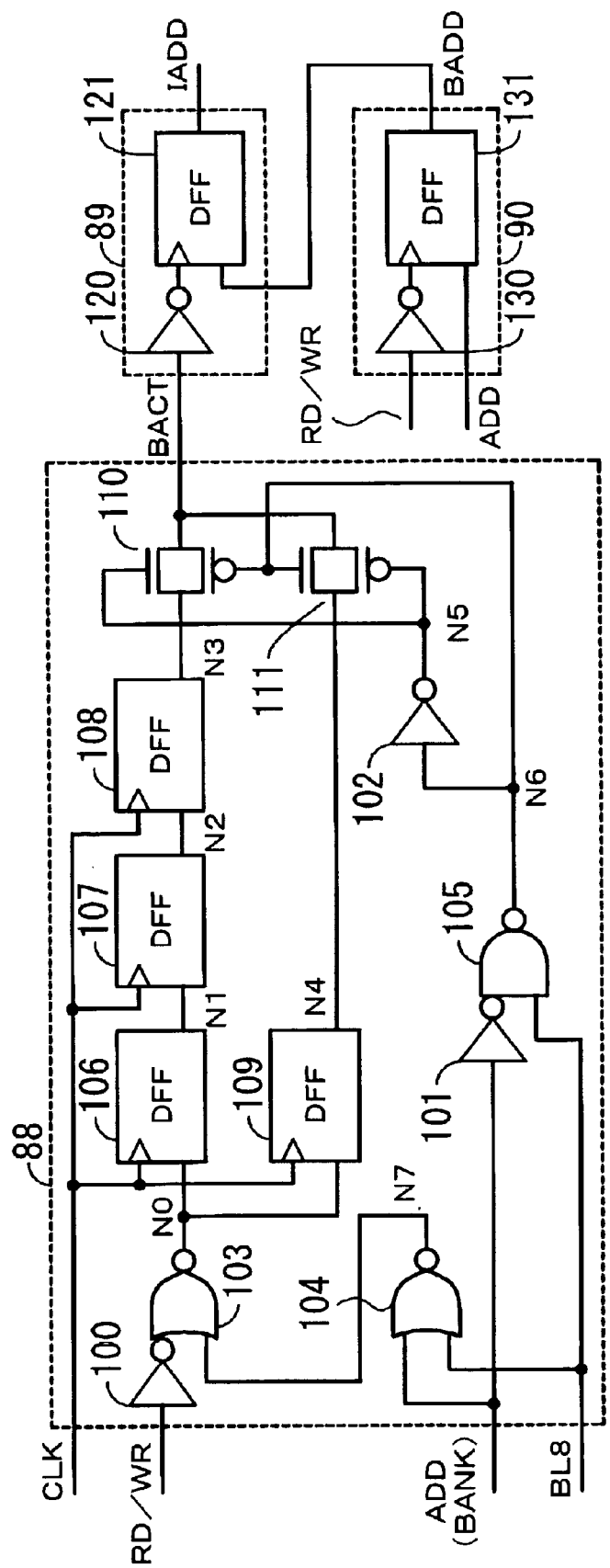
FIG. 6 is a diagram showing in detail exemplary configurations of a bank activation control circuit, a timing circuit and an ADD latch, all appearing in FIG. 5.

FIG. 6 shows in detail exemplary configurations of the bank activation control circuit 88, the timing circuit 89 and the ADD latch 90.

As shown in the figure, the bank activation control circuit 88 comprises inverters 100 to 102, NOR elements 103 and 104, a NAND element 105, DFF (Data Flip-Flop) elements 106 to 109, and CMOS (Complementary Metal-Oxide Semiconductor) switches 110 and 111.

The inverter 100 inverts the RD/WR signal input from the CMD decoder 86, and supplies the inverted signal to the NOR element 103. The NOR element 104 supplies the NOR element 103 with the result of inversion of a logical sum of the ADD signal input from the ADD input circuit 85 for specifying a bank and a BL8 signal (signal which turns to the "H" state when the burst length is set to "8") supplied from the burst length determination circuit 87.

The NOR element 103 supplies the DFF element 106 with the result of inversion of a logical sum of the outputs from the inverter 100 and the NOR element 104.

The DFF elements 106 to 108 sequentially delay the output of the NOR element 103 in synchronism with the trailing edge of the CLK signal. The output of the DFF element 108 is supplied to the CMOS switch 110.

The DFF element 109 latches the output of the NOR element 103 in synchronism with the trailing edge of the CLK signal, and supplies the latched signal to the CMOS switch 111.

The inverter 101 inverts the ADD signal and outputs the inverted signal to the NAND element 105, which then supplies the inverter 102 and the CMOS switches 110 and 111 with the result of inversion of a logical product of the output from the inverter 101 and the BL8 signal.

The CMOS switch 110 turns ON when the output of the NAND element 105 is in the "L" state, to supply the output of the DFF element 108 to the timing circuit 89 as a BACT signal, and turns OFF when the output of the NAND element 105 is in the "H" state.

The CMOS switch 111 turns ON when the output of the NAND element 105 is in the "H" state, to supply the output of the DFF element 109 to the timing circuit 89 as the BACT signal, and turns OFF when the output of the NAND element 105 is in the "L" state.

Accordingly, when the output of the NAND element 105 turns to "H", the CMOS switch 111 turns ON and the output of the DFF element 109 is supplied to the timing circuit 89 as the BACT signal; when the output of the NAND element 105 turns to "L", the CMOS switch 110 turns ON and the output of the DFF element 108 is supplied to the timing circuit 89 as the BACT signal.

The ADD latch 90 is constituted by an inverter 130 and a DFF element 131. The inverter 130 inverts the RD/WR signal and outputs the inverted signal to the DFF element 131, which then latches the ADD signal in synchronism with the trailing edge of the output from the inverter 130, that is, the leading edge of the RD/WR signal, and outputs the latched signal as a BADD signal.

The timing circuit 89 comprises an inverter 120 and a DFF element 121. The inverter 120 inverts the BACT signal which is the output of the CMOS switch 110. The DFF element 121 latches the BADD signal in synchronism with the trailing edge of the output from the inverter 120, that is, the leading edge of the BACT signal, and outputs the latched signal as the internal address IADD signal to the bank A 60 or the bank B 70.

Figure 7:
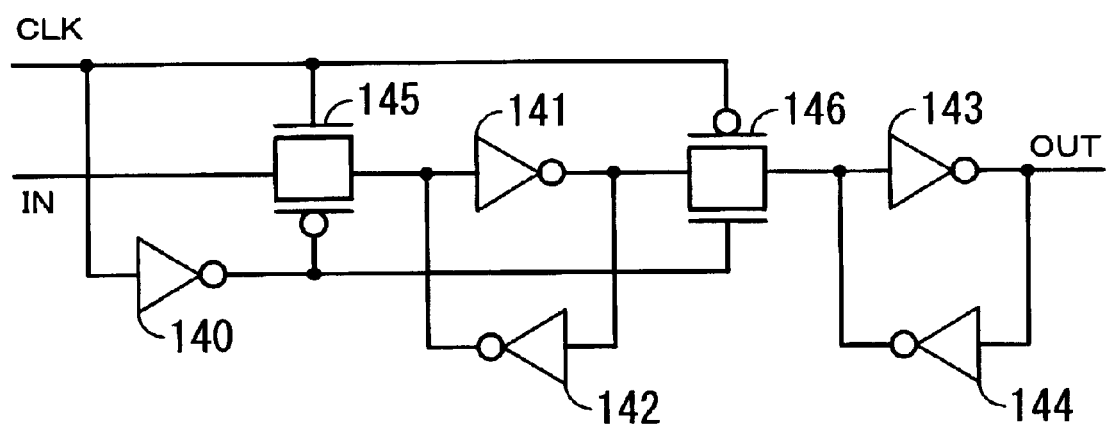
FIG. 7 is a circuit diagram showing in detail an exemplary configuration of a DFF element appearing in FIG. 6.

FIG. 7 shows in detail an exemplary configuration of the DFF elements 106 to 109 appearing in FIG. 6. As shown in the figure, each DFF element comprises inverters 140 to 144, and CMOS switches 145 and 146.

The inverter 140 inverts the CLK signal and supplies the inverted signal to the CMOS switches 145 and 146.

When the clock signal turns to "H", the CMOS switch 145 turns ON and supplies the input signal to the inverter 141.

When the clock signal turns to "L", the CMOS switch 146 turns ON and supplies the output of the inverter 141 to the inverter 143.

The inverter 141 inverts the output of the CMOS switch 145 and supplies the inverted output to the CMOS switch 146.

The inverter 142 inverts the output of the inverter 141 and feeds the inverted output back to the input of the inverter 141.

The inverter 143 inverts the output of the CMOS switch 146 and outputs the resulting signal.

The inverter 144 inverts the output of the inverter 143 and feeds the inverted output back to the input of the inverter 143.

Operation of the above embodiment will be now described.

When the power supply to the information processing system shown in FIG. 3 is started, the CPU 10 notifies the control device 20 of the number of data bits to be exchanged with the semiconductor memory device 30 in accordance with an application to be executed.

In accordance with the number of data bits notified from the CPU 10, the control device 20 sets a burst length for the semiconductor memory device 30. For example, in the case where the data bit length that can be read at a time from the bank A 60 or B 70 of the semiconductor memory device 30 is four and "8 bits" is set as the burst length, the control device 20 inputs a command for setting the burst length to the CMD input terminal 81 of the semiconductor memory device 30, as well as data indicative of the burst length "8" to the ADD input terminal 82. Although conventional semiconductor memory devices do not permit the burst length to be set to a length exceeding the number of data bits that can be read at a time from a bank thereof, such burst length setting can be performed in this embodiment.

As a result, the CMD decoder 86 detects the input of the command for setting the burst length, and requests the burst length determination circuit 87 to set the burst length. The burst length determination circuit 87 decodes the data supplied from the ADD input circuit 85 and recognizes that the burst length should be set to "8". Then, the circuit 87 turns the BL8 signal (signal which is set in the "H" state when the burst length is "8") to the "H" state, the BL8 signal being supplied to the bank activation control circuits 88 associated with the respective banks A 60 and B 70.

While in this state, if a read command to read data from the bank A 60 is input, the bank activation control circuit 88 of the bank A 60 operates in the manner described below with reference to FIGS. 8 and 9.

Figure 8:
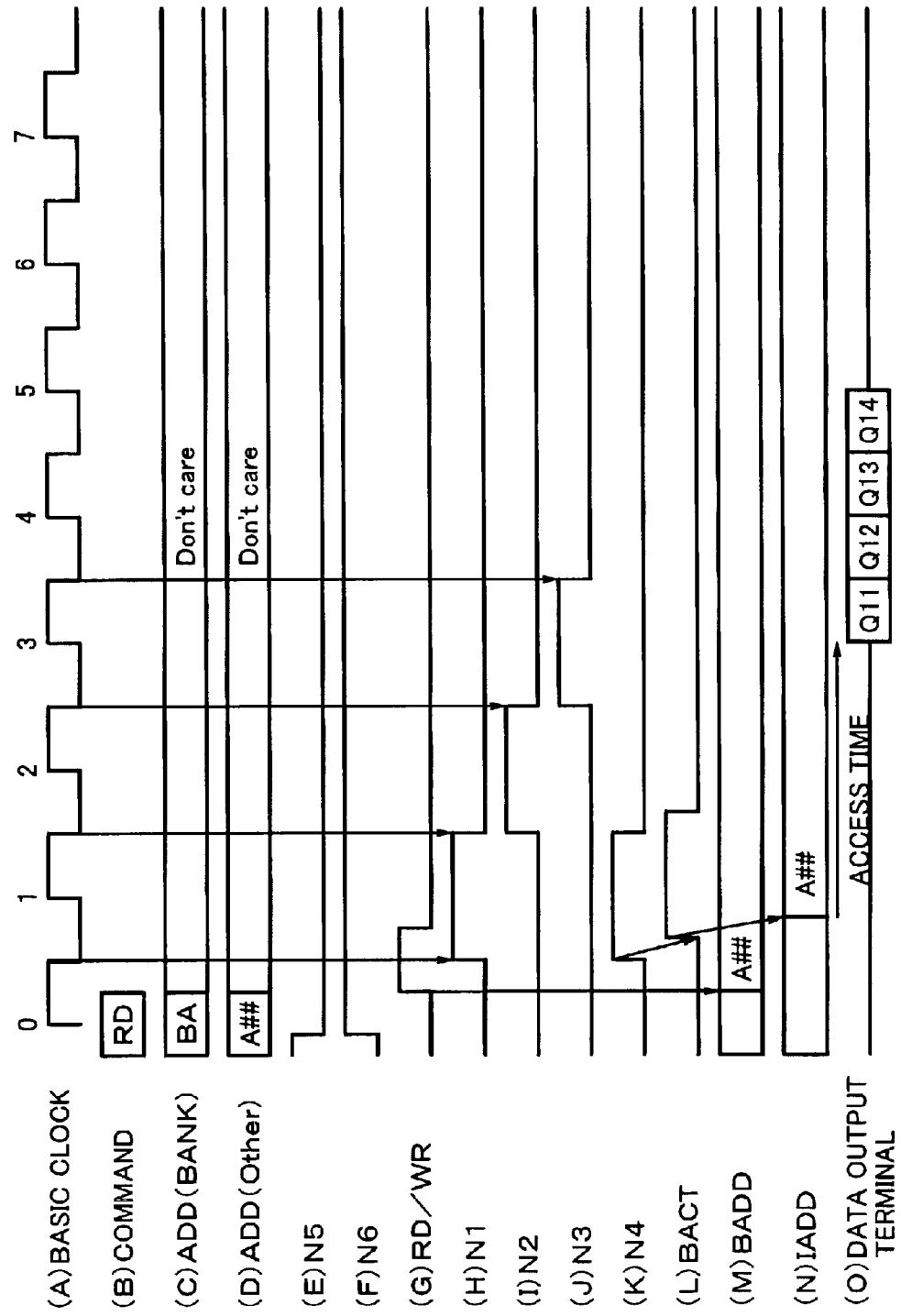
FIG. 8 is a timing chart illustrating an operation according to the embodiment shown in FIG. 2.

Let it be assumed that an RD command is input in synchronism with the leading edge of the zeroth clock pulse, as shown in (B) of FIG. 8, and that an address ((C) in FIG. 8) selecting the bank A 60 is supplied from the ADD input circuit 85.

The DFF elements 106 to 108 sequentially delay the output signal of the NOR element 103 in synchronism with the trailing edge of the CLK signal, and provide output signals N1 to N3, respectively ((H)–(J) in FIG. 8).

The DFF element 109 latches the output signal of the NOR element 103 in synchronism with the trailing edge of the CLK signal, and provides an output signal N4 ((K) in FIG. 8).

At this time, the output of the NAND element 105 in the bank activation control circuit 88 of the bank A 60 is in the "H" state, as shown in (F) of FIG. 8, and an N5 signal, which is the output of the inverter 102, is in the "L" state, as shown in (E) of FIG. 8, so that the CMOS switch 111 is in the ON state. Consequently, the N4 signal ((K) in FIG. 8), which is the output of the DFF element 109, is selected and supplied to the timing circuit 89 as the BACT signal ((L) in FIG. 8).

The ADD latch 90 latches the ADD signal in synchronism with the leading edge of the RD/WR signal, and supplies the latched signal to the timing circuit 89 as the BADD signal ((M) in FIG. 8).

The timing circuit 89 latches the BADD signal in synchronism with the leading edge of the BACT signal, and supplies the latched signal to the bank A 60 as the IADD signal ((N) in FIG. 8).

As a result, the bank A 60 reads data from the specified address and outputs the readout data from a DATA output terminal ((O) in FIG. 8), not shown.

Figure 9:
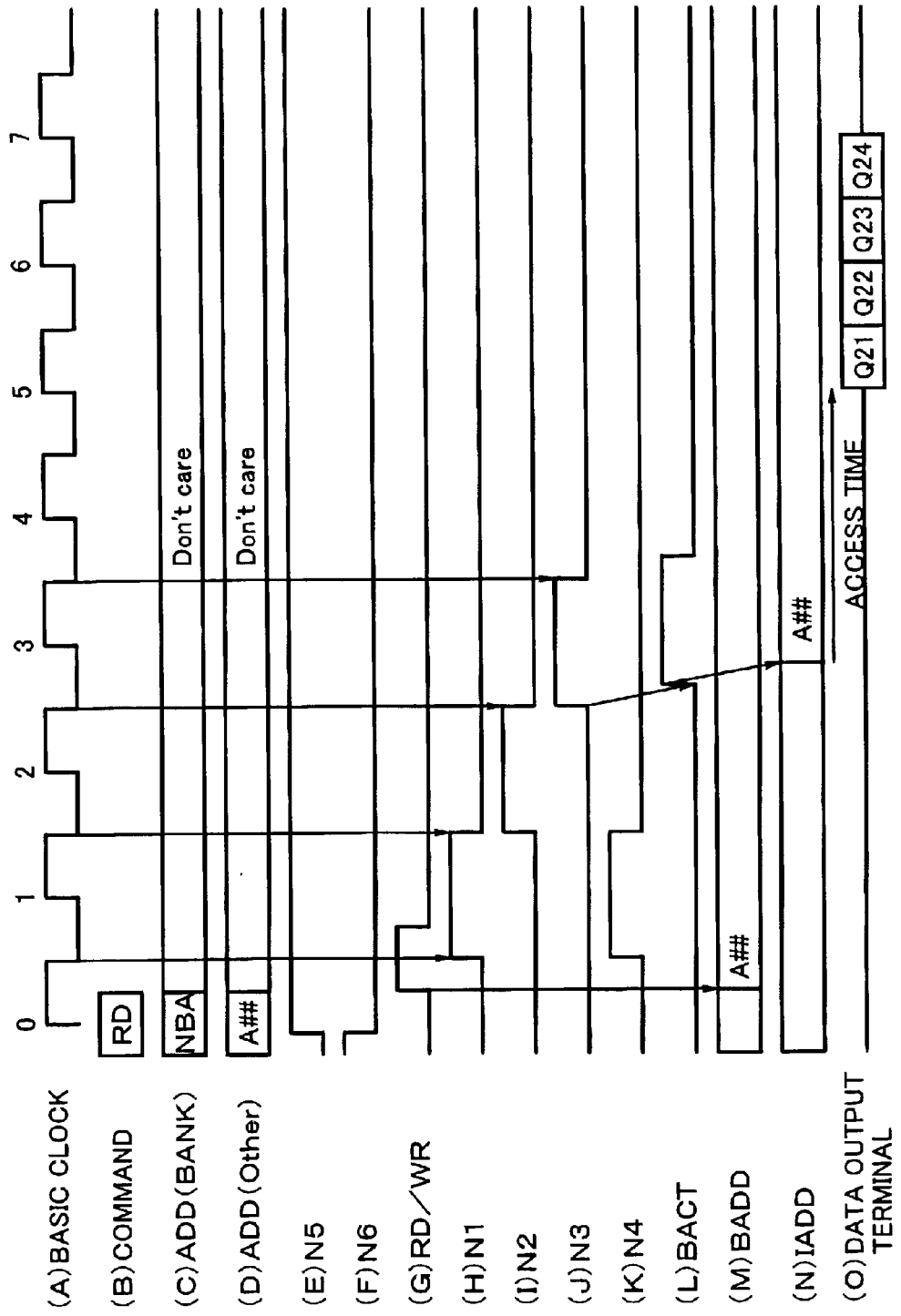
FIG. 9 is a timing chart also illustrating the operation according to the embodiment shown in FIG. 2.

At this time, in the bank activation control circuit 88 of the bank B 70, the N5 signal ((E) in FIG. 9) is in the "H" state while the N6 signal ((F) in FIG. 9) is in the "L" state, so that the output of the DFF element 108 is selected and supplied to the timing circuit 89.

The N3 signal ((J) in FIG. 9), which is the output of the DFF element 108, is derived by delaying the N1 signal ((H) in FIG. 9) for two cycles of the CLK signal, and accordingly, the BADD signal ((M) in FIG. 9) latched by the ADD latch 90 is supplied to the bank B 70 as the IADD signal while being delayed for two cycles of the CLK signal with respect to the IADD signal supplied to the bank A 60.

The bank B 70 reads out data stored at the address specified by the IADD signal supplied from the timing circuit 89, and outputs the readout data to outside from a DATA output terminal, not shown.

As a consequence, where the burst length has been set to "8", data is first read from one specified bank (in the above example, the bank A 60), and then data is read from the other bank (in the above example, the bank B 70) in an automatic manner (without the need for the reentry of address from outside) with a delay of two cycles of the CLK signal and is output to outside.

In the case where the semiconductor memory device 30 is an auto-precharge type device, auto-precharge operation is carried out upon completion of the read operation of the other bank.

In the aforementioned example, the bank A 60 is specified first and then the bank B 70 is specified. Also in the case where the bank B 70 is specified first and the bank A 60 is specified next, similar operation is executed and 8-bit data is output.

The foregoing describes the operation wherein the burst length is set to "8"; in cases where the burst length is set to "4" or a smaller value, data is read from only one of the banks and is output, as in the conventional memory devices.

Specifically, where the burst length is set to a value other than "8", the BL8 signal is set in the "L" state. Accordingly, the outputs of the NAND elements 105 of the respective banks A 60 and B 70 are always in the "H" state, and as a consequence, the CMOS switches 111 remain in the ON state.

In this case, the output of the NOR element 104 turns to "L" when the bank managed thereby is specified, and turns to "H" during the other period of time. Consequently, the NOR element 103 passes the RD/WR signal therethrough only while the bank associated therewith is selected, and shuts off the signal while the other bank is specified.

As a result, while the bank is specified, the signal output from the corresponding DFF element 109 is supplied to the timing circuit 89 as the BACT signal, and the BADD signal latched by the ADD latch 90 is supplied to the bank as the IADD signal in synchronism with the leading edge of the BACT signal.

Accordingly, where the burst length is set to "4", for example, IADD is supplied only to the bank specified by the bank-specifying address, and data stored in the corresponding address is read and is output to outside from the DATA output terminal, not shown, whereupon the operation is completed.

In the case where the burst length is set to "8", while one of the banks is accessed, the other bank cannot be accessed. If an interrupt request is made with respect to a bank other than the bank being accessed, therefore, the control device 20 performs a process for inhibiting execution of such an interrupt request.

Also, where the burst length is set to "8", a total of the time periods required to read data from the two banks constitutes a cycle time. Accordingly, the control device 20 determines the cycle time in accordance with the burst length, and performs control operation suited for the determined cycle time.

In the above description of the embodiment, the banks used are two in number, but the present invention can of course be applied to memory configuration including three or more banks.

Also, it is to be noted that the circuitry explained and illustrated in conjunction with the above embodiment is given by way of example only, and that the present invention is of course not limited to the illustrated circuitry.

Figure 10:
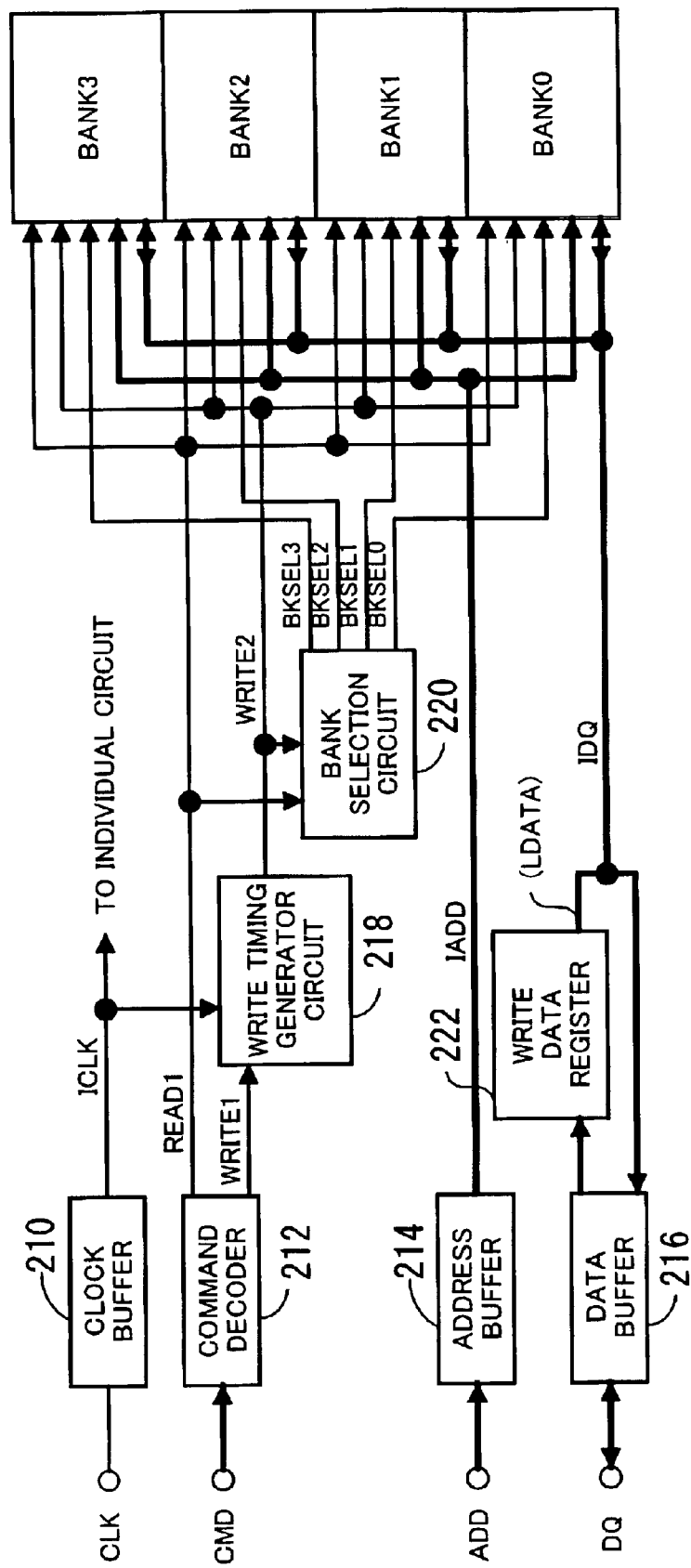
FIG. 10 is a block diagram showing a second embodiment.

FIG. 10 shows a semiconductor memory device according to a second embodiment of the present invention, the second embodiment corresponding to claims 6 to 8. In the figure, each thick line signifies that the line comprises a plurality of signal lines.

The semiconductor memory device is formed using a CMOS process on a silicon substrate as a clock synchronization type DRAM. The DRAM comprises a clock buffer 210, a command decoder 212, an address buffer 214, a data buffer 216, a write timing generator circuit 218, a bank selection circuit 220, a write data register 222, and four memory banks BANK0 to BANK3.

The clock buffer 210 receives a clock signal CLK from outside through a clock terminal, and outputs the received signal as an internal clock signal ICLK. The internal clock signal ICLK is supplied also to other circuits than those illustrated.

The command decoder 212 receives a command signal CMD from outside through a command terminal, decodes the received signal, and outputs the decoded signal as a read command signal READ1 and a write command signal WRITE1. The command decoder 212 outputs a refresh command signal etc., besides the illustrated signals.

The address buffer 214 receives an address signal ADD from outside through an address terminal, and outputs the received signal as an internal address signal IADD. The data buffer 216 receives a data signal (write data) DQ from outside through a data terminal, and outputs the received signal to the write data register 222. Also, the data buffer 216 receives an internal data signal (readout data) IDQ from the memory banks BANK0 to BANK3, and outputs the received signal via the data terminal as the data signal DQ. The write data register 222 latches the write data and outputs the latched data as the internal data signal IDQ (latched data signal LDATA).

The write timing generator circuit 218 receives the write command signal WRITE1 and the internal clock signal ICLK, and outputs a write command signal (write timing signal) WRITE2 in synchronism with the internal clock signal ICLK. The write command signal WRITE2 is generated four times consecutively in response to one write command signal WRITE1, as described later.

The bank selection circuit 220 activates one of bank selection signals BKSEL0 to BKSEL3 synchronously with activation of the read command signal READ1 and the write command signal WRITE2.

The memory banks BANK0 to BANK3 have identical addresses assigned thereto and each have a storage capacity of 16 Megabits, for example. Thus, the write data DQ supplied in response to the write command is written into all of the memory banks BANK0 to BANK3, as described later. Namely, this DRAM is used as a 16-Megabit memory, though it has a total storage capacity of 64 Megabits.

Also, although not illustrated in detail, the memory banks BANK0 to BANK3 each have a plurality of memory cells connected to word lines and bit lines, sense amplifiers for amplifying data transmitted onto the bit lines, column switches connecting the bit lines and a data bus line, a row decoder, and a column decoder. The row decoder activates a sense amplifier and selects a word line in accordance with a high-order address signal ADD. The column decoder selects a column switch in accordance with a low-order address signal ADD.

In this embodiment, the high-order and low-order address signals ADD are input to the DRAM collectively along with the read command and the write command. Namely, the DRAM is an address non-multiplex type semiconductor memory. The memory banks BANK0 to BANK3 operate independently of one another and, after the operation, automatically precharge the bit lines under their own control.

Figure 11:
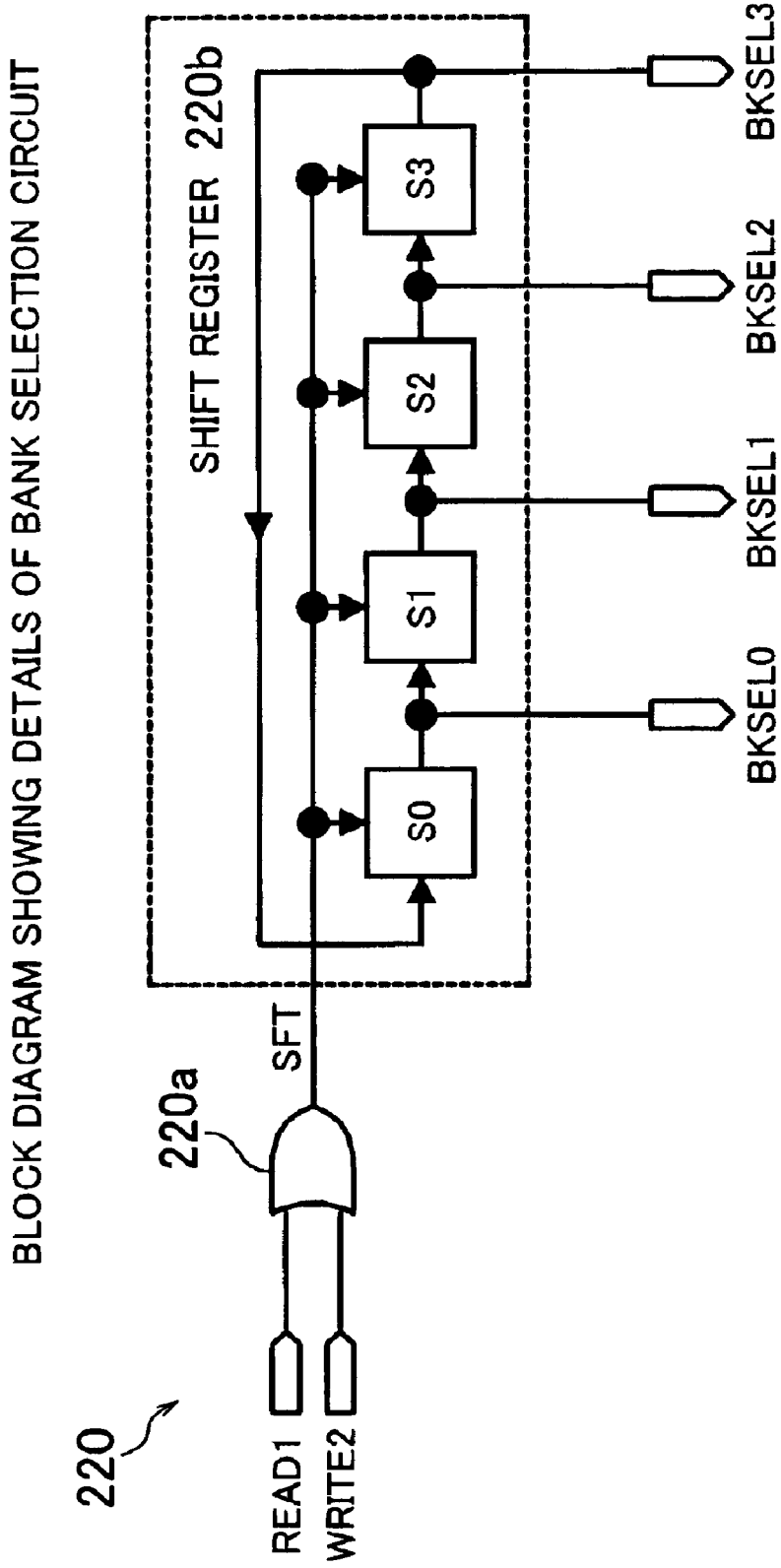
FIG. 11 is a block diagram showing details of a bank selection circuit appearing in FIG. 10.

FIG. 11 shows details of the bank selection circuit 220 appearing in FIG. 10. The bank selection circuit 220 includes an OR element 220*a* and a shift register 220*b*. The OR element 220*a* derives an OR of the read command signal READ1 and the write command signal WRITE2, and outputs the result as a shift signal SFT. The shift register 220*b* has four storage stages S0 to S3 connected in series.

The storage stages S0 to S3 output the bank selection signals BKSEL0 to BKSEL3, respectively. The output (BKSEL3) of the storage stage S3 is fed back to the input of the storage stage S0. Each of the storage stages S0 to S3 operates in synchronism with the shift signal SFT, to output the value retained thereby to the succeeding stage.

The shift register 220*b* is initialized after the start of power supply such that only the bank selection signal BKSEL0 has a high-level output. Subsequently, each time the read command signal READ1 or the write command signal WRITE2 is activated, the shift register 220*b* performs a shift operation to sequentially turn the bank selection signals BKSEL1, BKSEL2, BKSEL3, BKSEL0, . . . to high level. When one of the bank selection signals BKSEL0 to BKSEL3 is activated, a corresponding one of the memory banks BANK0 to BANK3 is set operable.

Figure 12:
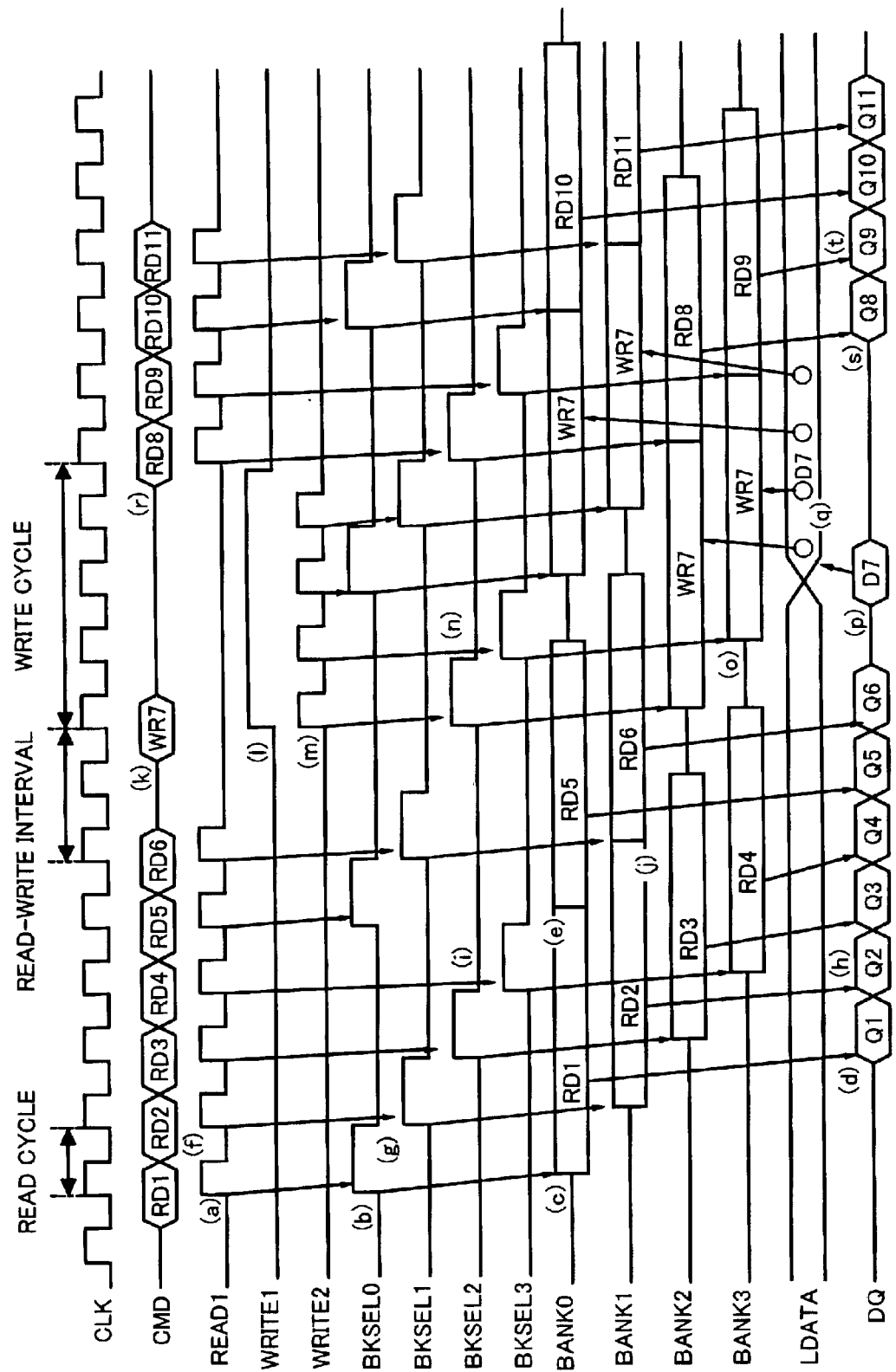
FIG. 12 is a timing chart illustrating an operation according to the second embodiment.

FIG. 12 illustrates operation of the DRAM described above. In the example shown in FIG. 12, first, read commands RD1 to RD6 are sequentially supplied, and then a write command WR7 is supplied, followed by the supply of read commands RD8 to RD11. Each command is supplied in synchronism with the leading edge of the clock signal CLK.

First, the command decoder 212 shown in FIG. 10 receives the read command RD1 and activates the read command signal READ1 ((a) in FIG. 12). In synchronism with the read command signal READ1, the bank selection circuit 220 activates the bank selection signal BKSEL0 ((b) in FIG. 12). The memory bank BANK0 is thereafter activated in response to the bank selection signal BKSEL0 ((c) in FIG. 12).

In accordance with the high-order address signal ADD (not shown), the memory bank BANK0 selects a word line and activates a sense amplifier. The selection of a word line permits data to be read from a corresponding memory cell to the bit line, and the readout data is amplified by the sense amplifier. Further, in accordance with the low-order address signal ADD, the memory bank BANK0 selects a column switch to transmit the readout data, amplified by the sense amplifier, to the data bus line.

The readout data Q1 read from the memory cell is output in synchronism with the leading edge of a clock signal CLK pulse two cycles later than the supply of the read command RD1 ((d) in FIG. 12). Namely, a read latency, which is expressed as the number of clock pulses from the supply of the read command RD1 to the output of the readout data Q1, is "2".

Subsequently, the memory bank BANK0 inactivates the sense amplifier and the row and column decoders, executes a precharge operation in which the bit line is set to a reference voltage, and completes the read operation four clock cycles after the reception of the read command RD1 ((e) in FIG. 12).

Then, in response to the read command RD2, the read command signal READ1 is activated again ((f) in FIG. 12). The shift register 220b of the bank selection circuit 220 performs a shift operation synchronously with the read command signal READ1, thereby inactivating the bank selection signal BKSEL0 and activating the bank selection signal BKSEL1 ((g) in FIG. 12). Subsequently, in response to the bank selection signal BKSEL1, the memory bank BANK1 is activated. The memory bank BANK1 performs a read operation in the same manner as performed by the memory bank BANK0, and outputs readout data Q2 ((h) in FIG. 12).

Subsequently, in response to the read commands RD3 to RD6, the bank selection signals BKSEL2, BKSEL3, BKSEL0 and BKSEL1 are sequentially activated ((i) in FIG. 12), and the memory banks BANK2, BANK3, BANK0 and BANK1 successively carry out read operation in the same manner as described above ((j) in FIG. 12).

Thus, the read operations of the four memory banks BANK0 to BANK3 are carried out in a manner such that one read operation overlaps with another while being staggered therefrom by one clock cycle. The operation period of one memory bank is four clock cycles, but since the four memory banks BANK0 to BANK3 operate independently of each other, the read cycle, which is a read operation time (read command RD supply interval) required for one read command RD, corresponds to one clock cycle.

Figure 26:
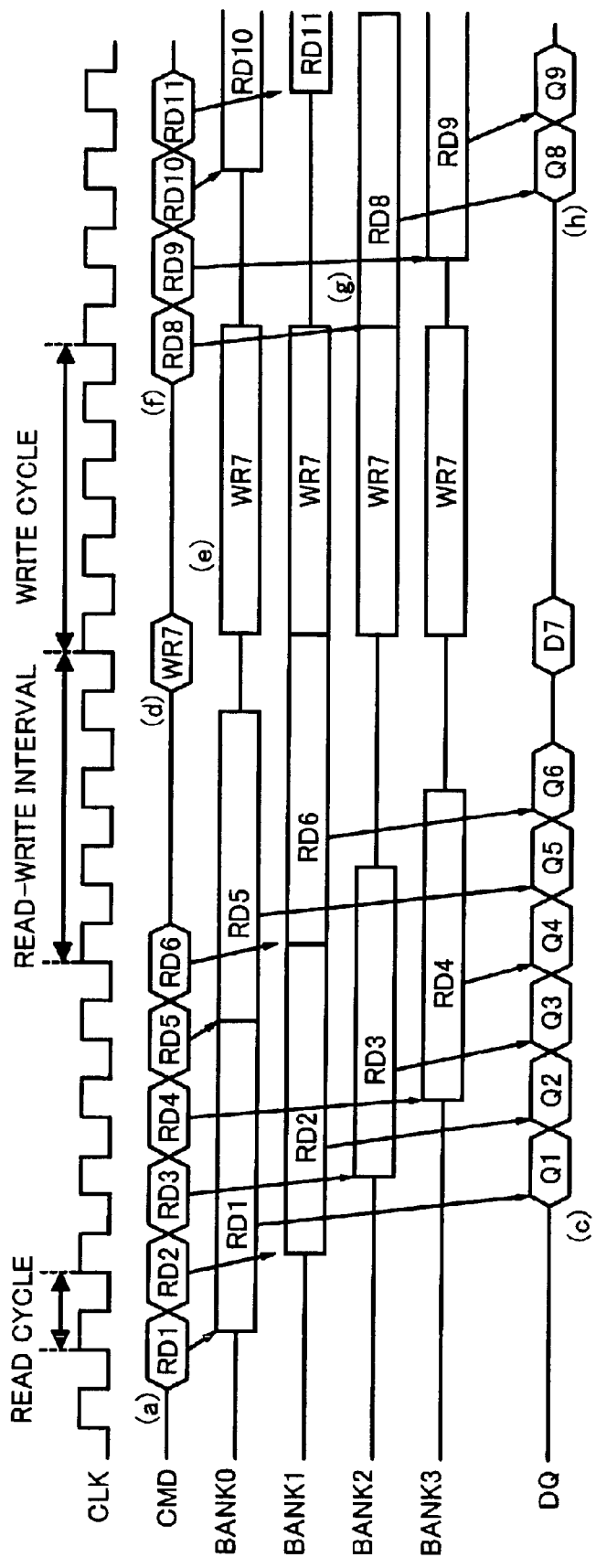
FIG. 26 is a timing chart illustrating an operation of a conventional semiconductor memory device.

The write command WR7 is supplied two clock cycles after the supply of the read command RD6 ((k) in FIG. 12). As distinct from the conventional device, some of the memory banks BANK (in this example, BANK0 and BANK1) are executing read operation when the write command WR7 is supplied. In this manner, write operation for writing data in an idle memory bank BANK is started while some of the memory banks BANK are still in operation, whereby the READ-WRITE interval (timing specification) from the supply of the read command RD6 to the supply of the write command WR7 can be set to two clock cycles. This interval is shorter by two clock cycles than in the case of the conventional device shown in FIG. 26. More specifically, the READ-WRITE interval is set to a timing such that contention between the data bus line and the data terminal can be avoided when a write latency is "2" (mentioned later).

The command decoder 212 receives the write command WR7 and activates the write command signal WRITE1 for four clock cycles ((l) in FIG. 12). During the period in which the write command signal WRITE1 remains activated, the write timing generator circuit 218 generates the write command signal (write timing signal) WRITE2 in synchronism with the clock signal CLK (internal clock signal ICLK) ((m) in FIG. 12). Specifically, the write command signal WRITE2 is activated four times consecutively, corresponding to the number of the memory banks BANK0 to BANK3. In synchronism with the write command signal WRITE2, the bank selection circuit 220 sequentially activates the bank selection signals BKSEL2, BKSEL3, BKSEL0 and BKSEL1 ((n) in FIG. 12). In response to the bank selection signals BKSEL2, BKSEL3, BKSEL0 and BKSEL1, the memory banks BANK2, BANK3, BANK0 and BANK1 are sequentially activated ((o) in FIG. 12).

The OR element 220a of the bank selection circuit 220 outputs the shift signal SFT synchronously with the read command signal READ1 and the write command signal WRITE2. The shift register 220b performs a shift operation in synchronism with the shift signal SFT, thereby sequentially activating the bank selection signals BKSEL0 to BKSEL3. In other words, the shift register 220b performs shift operation regardless of whether the input command is the read or write command, to sequentially activate the bank selection signals BKSEL0 to BKSEL3, whereby a memory bank for performing read or write operation is sequentially switched among the memory banks BANK0 to BANK3. Thus, the bank selection circuit 220 is constructed simply by using the OR element 220a and the shift register 220b, and this makes it possible to greatly shorten the READ-WRITE interval, compared with the conventional device.

Write data D7 is supplied two clock cycles after the supply of the write command WR7 ((p) in FIG. 12). Namely, the write latency, which is the number of clock cycles from the supply of the write command WR7 to the supply of the write data D7, is "2". The write data register 222 fetches the write data D7 through the data buffer 216 and holds the fetched data as the latched data signal LDATA ((q) in FIG. 12).

The memory banks BANK2, BANK3, BANK0 and BANK1 then operate sequentially, so that the latched data signal LDATA held by the write data register 222 is written into the memory cells. That is, identical write data D7 is written into all memory banks BANK0 to BANK3.

The memory bank BANK2, which is the first to perform the write operation, becomes idle four clock cycles after the supply of the write command WR7. Accordingly, even though the write operations performed by the memory banks BANK0 to BANK3 are staggered, the read command RD8 can be supplied four clock cycles after the supply of the write command WR7 ((r) in FIG. 12). Namely, the write cycle required for one write command WR is four clock cycles, equal to that in the case of the conventional device.

In response to the read command RD8, the memory bank BANK2 operates and outputs readout data Q8 ((s) in FIG. 12). Subsequently, the read commands RD9 to RD11 are sequentially supplied, so that the memory banks BANK3, BANK0 and BANK1 sequentially perform read operation and output readout data Q8 to Q11 in the same manner as described above ((t) in FIG. 12).

As explained above, in this embodiment, the write timing generator circuit 218 consecutively generates, in response to one write command WR, the write command signal (write timing signal) WRITE2 a number of times corresponding to the number of the memory banks BANK0 to BANK3. During write operation, the bank selection circuit 220 sequentially activates the bank selection signals BKSEL0 to BKSEL3 in synchronism with the write timing signal WRITE2. Consequently, the write operations of all memory banks BANK0 to BANK3 can be easily carried out in response to one write command WR with their start timings staggered.

Also, write operation can be started before all of the memory banks BANK0 to BANK3 become idle, so that the interval from the supply of the read command RD to the supply of the write command WR can be shortened. Further, in cases where read commands RD are supplied with a write command WR intervening therebetween, the read command RD supply interval can be shortened as compared with the conventional device, making it possible to increase the number of commands supplied per given time. Thus, since the data signal can be input/output more frequently than in the conventional device, the data transfer rate (data bus occupancy) improves, and as a result, the performance of the system to which the DRAM is mounted can be enhanced.

Further, the bank selection circuit 220 comprises the shift register 220b which is simple in construction, and this permits the data transfer rate to be improved without increasing the chip size of the DRAM.

Figure 13:
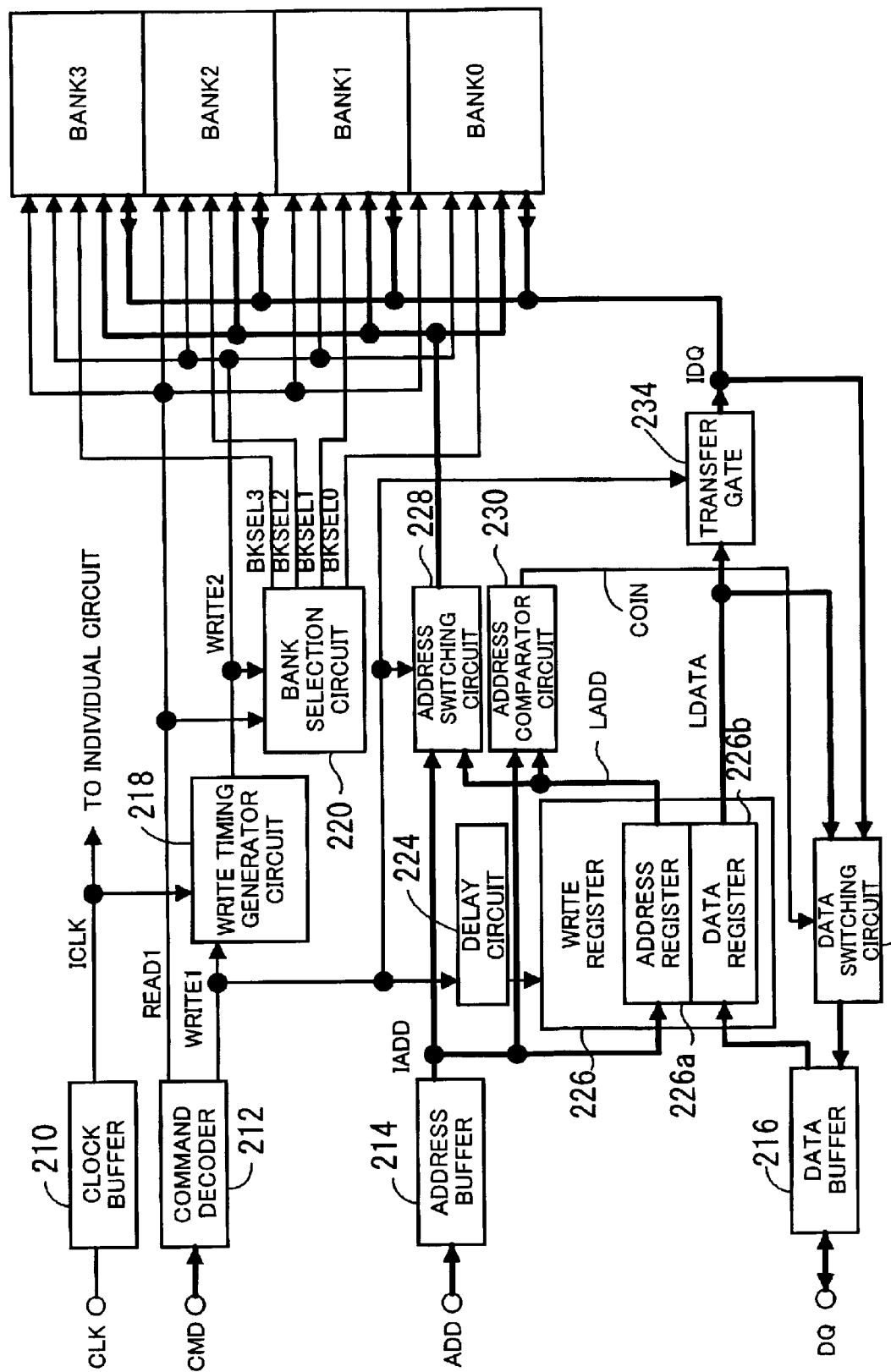
FIG. 13 is a block diagram showing a third embodiment.

FIG. 13 shows a semiconductor memory device according to a third embodiment of the present invention, the third embodiment corresponding to claims 6 to 10. Identical reference numerals and symbols are used to denote circuits and signals identical with those explained above in relation to the second embodiment, and detailed description of such circuits and signals is omitted.

Compared with the second embodiment, the third embodiment is additionally provided with a late write function. The late write function is a function whereby write data supplied in association with a write command is written into the memory cells when the succeeding write command is supplied. The late write function serves to narrow down the timing of contention between readout data and write data, thus improving the efficiency of use of the data bus. In order to perform the late write function, the third embodiment is additionally provided with a delay circuit 224, a write register 226, an address switching circuit 228, an address comparator circuit 230, a data switching circuit 232 and a transfer gate 234, compared with the second embodiment. In other respects, the third embodiment is configured in almost the same manner as the second embodiment. Namely, the semiconductor memory device is fabricated as a clock synchronization type DRAM.

The delay circuit 224 delays the write command signal WRITE1 for a time period corresponding to the write latency (in this embodiment, "3"), and outputs the delayed signal to the write register 226. The write register 226 includes an address register 226a and a data register 226b which operate in synchronism with the delayed write command signal WRITE1. The address register 226a holds the address signal ADD (internal address signal IADD) and outputs the signal held thereby as a latched address signal LADD. The data register 226b holds the data signal DQ (write data) and outputs the signal held thereby as a latched data signal LDATA.

The address switching circuit 228 selects the internal address signal IADD when the level of the write command signal WRITE1 is low, and selects the latched address signal LADD when the level of the write command signal WRITE1 is high. Consequently, the memory banks BANK0 to BANK3 operate in accordance with the latched address signal LADD during write operation, and operate in accordance with the external address signal ADD during read operation.

The address comparator circuit 230 activates (raises the level of) a coincidence signal COIN when the internal address signal IADD coincides with the latched address signal LADD. The address comparator circuit 230 determines whether or not the write address is for a memory cell that has not performed the write operation yet.

The data switching circuit 232 selects the latched data signal LDATA when the level of the coincidence signal COIN is high, and outputs the selected signal as the readout data. When the level of the coincidence signal COIN is low, the data switching circuit selects the internal data signal DQ (readout data) read from the memory banks BANK and outputs the selected signal as the readout data.

The transfer gate 234 transfers the latched data signal LDATA to the memory banks BANK0 to BANK3 as the internal data signal (write data) DQ when the level of the write command signal WRITE1 is high. Namely, the write operation is performed using the latched data signal LDATA held by the data register 226b.

Figure 14:
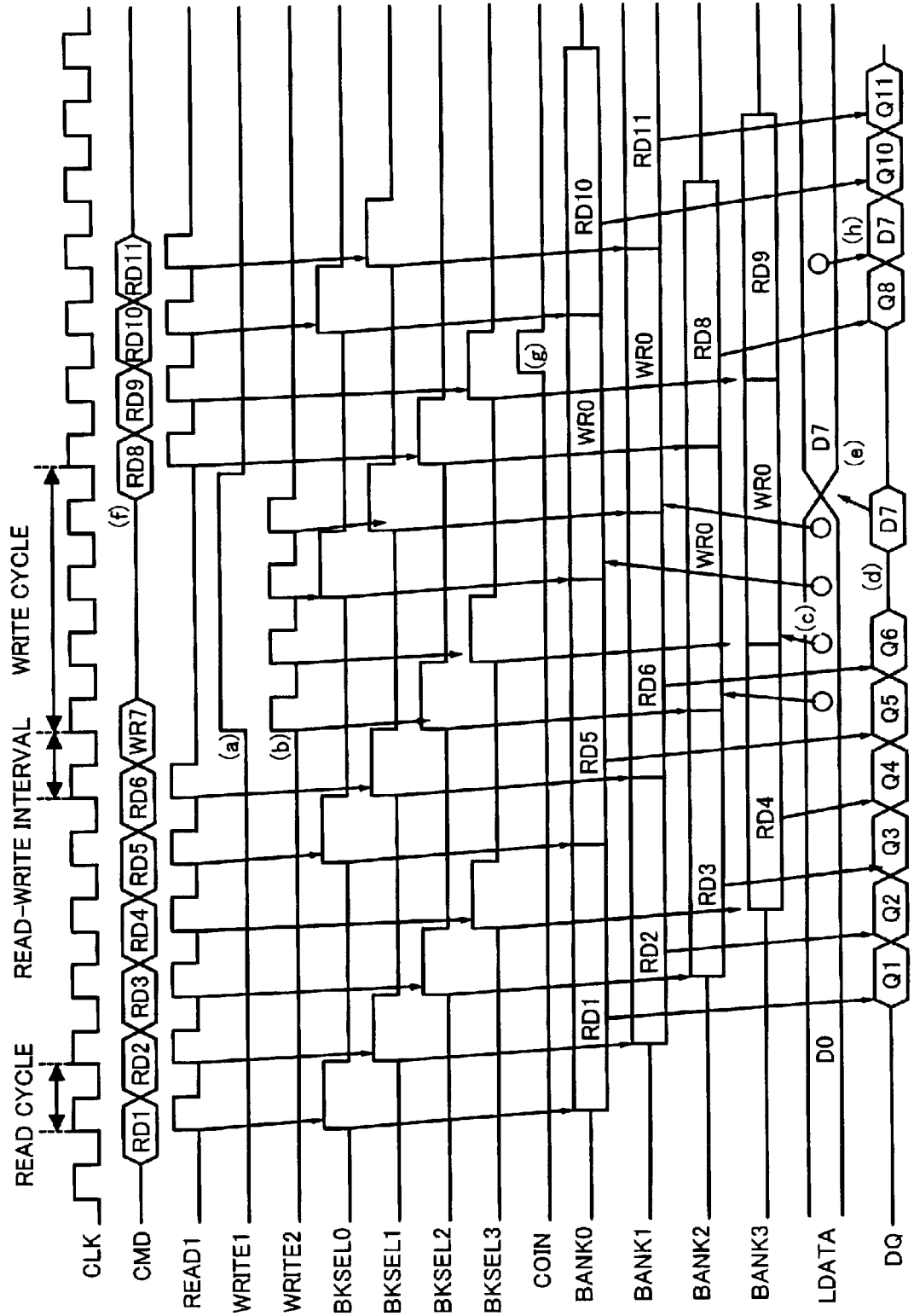
FIG. 14 is a timing chart illustrating an operation according to the third embodiment.

FIG. 14 illustrates operation of the DRAM described above. FIG. 14 shows an example of operation wherein, as in the case of the second embodiment, after read commands RD1 to RD6 are sequentially supplied, a write command WR7 is supplied, followed by the supply of read commands RD8 to RD11. Read operations performed in response to the read commands RD1 to RD6 are identical with those explained above with reference to FIG. 12, and therefore, description thereof is omitted.

The DRAM of this embodiment has the late write function as mentioned above. The timing for supplying the write command WR7 can therefore be set independently of the timing for supplying the write data D7. This makes it possible to supply the write command WR7 in synchronism with a clock signal CLK pulse immediately after the supply of the read command RD6. Namely, in this embodiment, the READ-WRITE interval (timing specification) from the supply of the read command RD6 to the supply of the write command WR7 can be shortened to one clock cycle. The read cycle and the write cycle are one clock cycle and four clock cycles, respectively, as in the second embodiment.

In response to the write command WR7, the write command signal WRITE1 is activated for four clock cycles ((a) in FIG. 14). Responsive to the activation of the write command signal WRITE1, the write command signal WRITE2 is activated four times consecutively ((b) in FIG. 14).

During the period in which the write command signal WRITE1 remains activated, the transfer gate 234 transfers the latched data signal LDATA to the memory banks BANK0 to BANK3. In the illustrated example, write data D0 which has been supplied in association with the preceding write command is sequentially written into all of the memory banks BANK0 to BANK3 synchronously with the write command WR7 ((c) in FIG. 14).

The write data D7 is supplied three clock cycles after the supply of the write command WR7 ((d) in FIG. 14). Namely, the write latency is set to "3". The write register 226 latches the address signal and the write data D7 in synchronism with the delayed write command signal WRITE1 ((e) in FIG. 14). The write data D7 latched by the write register 226 is written into the memory banks BANK0 to BANK3 in response to the succeeding write command (not shown).

After a lapse of four clock cycles from the supply of the write command WR7, the read commands RD8 to RD11 are sequentially supplied ((f) in FIG. 14). In response to the read commands RD8 to RD11, the memory banks BANK2, BANK3, BANK0 and BANK1 sequentially perform read operation. It is assumed here that the address signal ADD (not shown) supplied along with the read command RD9 coincides with the latched address signal LADD held by the address register 226a.

In this case, the address comparator circuit 230 judges that the address signal ADD supplied along with the read command RD9 coincides with the latched address signal LADD, and accordingly, activates the coincidence signal COIN ((g) in FIG. 14). Namely, it is judged that data to be read out in response to the read command RD9 is not yet written in the memory banks BANK0 to BANK3. Thus, on detecting the activation of the coincidence signal COIN, the data switching circuit 232 outputs, as the readout data, the latched data signal LDATA (write data D7) held by the data register 226b ((h) in FIG. 14). The read operations in response to the read commands RD8, RD10 and RD11 are performed in the same manner as in the second embodiment.

This embodiment also provides advantages similar to those achieved by the second embodiment described above. Further, since this embodiment is provided with the write register 226 for holding the write address and write data supplied in association with the write command WR, as well as with the address switching circuit 228 and the transfer gate 234, the write data supplied in association with the write command can be written into the memory cells when the succeeding write command is supplied (late write function). The late write function serves to reduce the combinations of contention between readout data and write data, whereby the efficiency of use of the data bus can be further improved. It is also possible to set the write command WR supply timing independently of the write data supply timing. As a result, the data transfer rate can be further increased.

The address comparator circuit 230 and the data switching circuit 232 permit correct readout data to be output without fail even in the event that data to be read out in response to the read command RD is not yet written in the memory banks BANK0 to BANK3.

Figure 15:
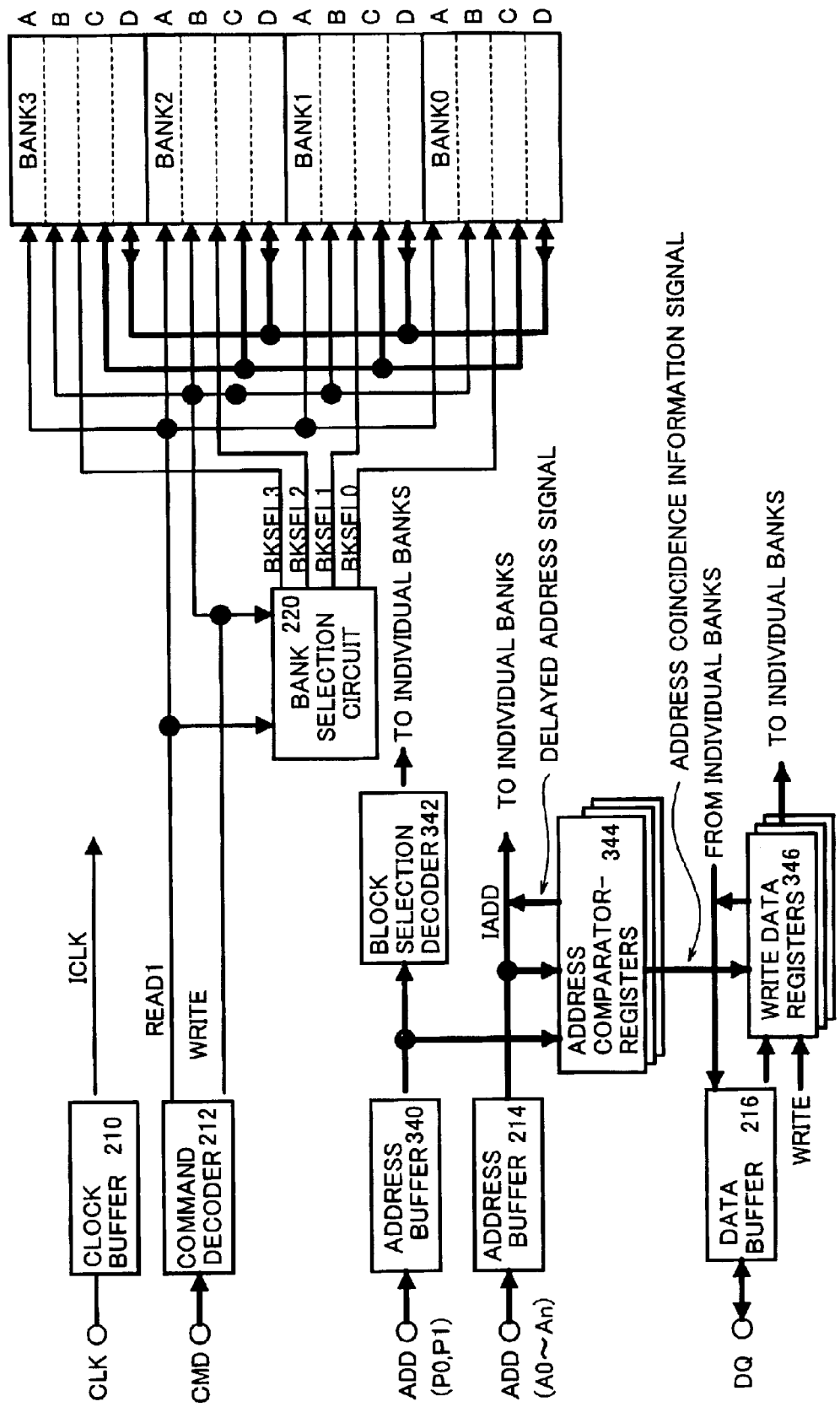
FIG. 15 is a block diagram illustrating a fourth embodiment.

FIG. 15 shows a semiconductor memory device according to a fourth embodiment of the present invention, the fourth embodiment corresponding to claims 11 to 13. Identical reference numerals and symbols are used to denote circuits and signals identical with those explained above in relation to the second embodiment, and detailed description of such circuits and signals is omitted.

Compared with the second embodiment, the fourth embodiment does not include the write timing generator circuit 218 and is additionally provided with an address buffer 340, a block selection decoder 342, address comparator-registers 344, and write data registers 346. Also, the memory banks BANK0 to BANK3 are each divided into blocks A to D and the bank selection circuit 220 partly differs in construction from that of the second embodiment.

The bank selection circuit 220 includes read and write shift registers (similar to the shift register 220b of the aforementioned bank selection circuit 220). The read register is input with signals (which are set to "H" state during write operation and associated with the respective banks) indicating whether or not data is being written into the respective banks. When supplied with the read command, the read register performs a shift operation to shift the target memory bank, and if the target memory bank after the shift operation is then performing write operation, the read register again performs a shift operation. The shift operation is repeated until the target memory bank is shifted to an active memory bank which is not performing write operation.

On the other hand, when supplied with the write command, the write shift register similarly performs a shift operation, and if the target bank after the shift operation is then performing read operation, the write operation is carried out on completion of the read operation.

The address buffer 340 receives an address signal ADD from outside through an address terminal, and outputs the received signal to the block selection decoder 342. The address buffer 214 is supplied with an address signal A0-An for selecting the memory banks BANK0 to BANK3, while the address buffer 340 is supplied with an address signal P0-Pn for selecting the memory blocks A to D.

In accordance with the signal output from the address buffer 340, the block selection decoder 342 selects a specified one of the memory blocks A to D of the individual memory banks BANK0 to BANK3.

The address comparator-registers 344, which are equal in number to the write data registers 346, hold addresses to which data is being or about to be written. On receiving a read request, the address comparator-registers compare the address from which data is to be read out with the addresses stored in their registers and, if coincidence of addresses is found, output address coincidence information to the write data registers 346.

The write data registers 346 are provided so as to correspond to the blocks and latch and temporarily store write data to be written into the respective blocks. When the quantity of stored data has reached a given quantity, the write data registers output the stored data to the corresponding banks. Also, when a read command to read out data that is not yet written into the memory cells is received, the write data registers 346 read out corresponding data and supply same to the data buffer 216.

Figure 16:
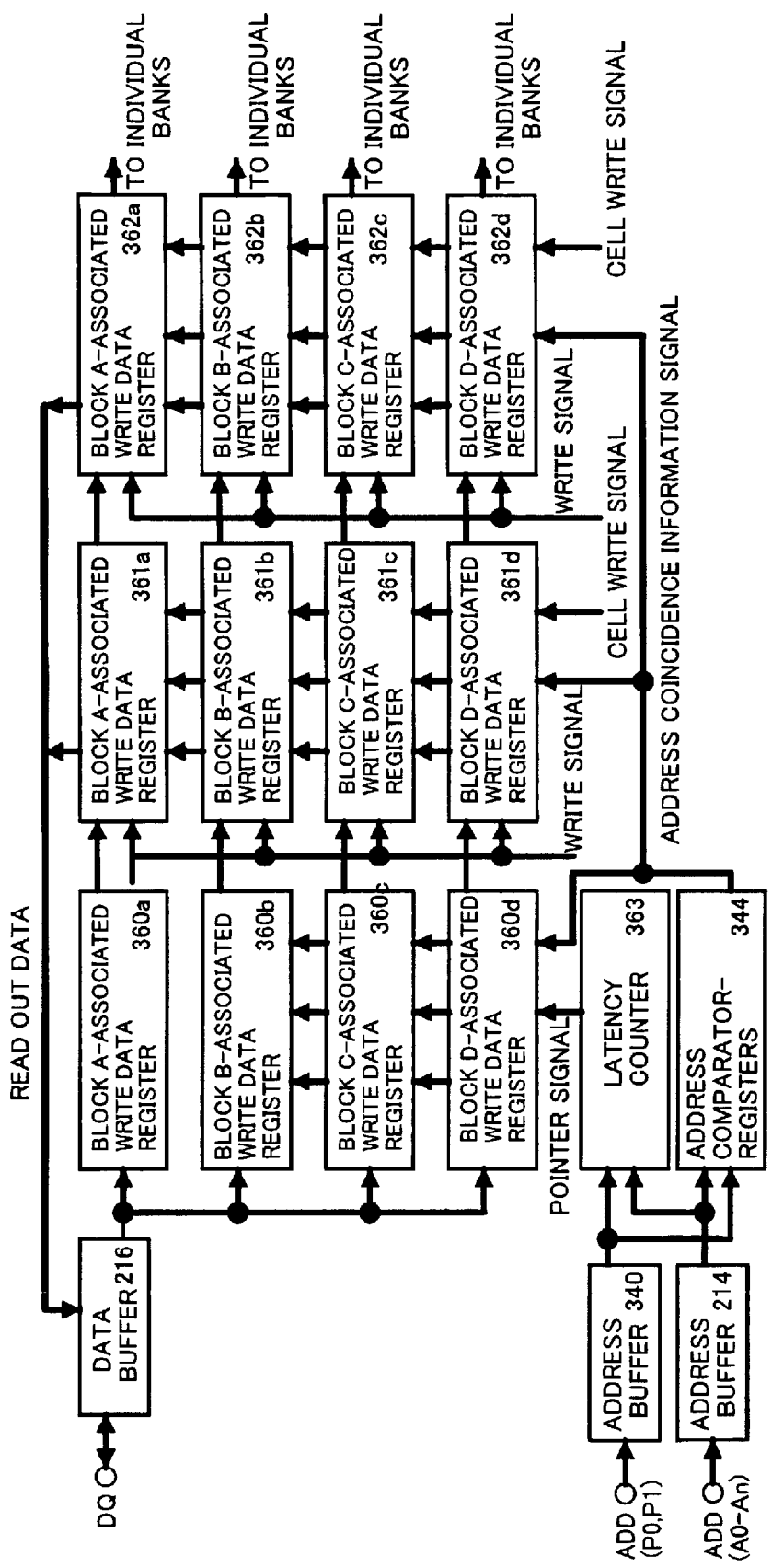
FIG. 16 is a block diagram showing details of write data registers appearing in FIG. 15.

FIG. 16 shows details of the write data registers 346. As shown in the figure, the write data registers 346 comprise three write data register groups each including four write data registers associated with the respective blocks A to D, namely, write data register groups 360a–360d, 361a–361d and 362a–362d, and a latency counter 363.

In accordance with a pointer signal from the latency counter 363, the block A-associated write data register 360a latches the write data supplied from the data buffer 216 and outputs the latched write data to the block A-associated write data register 361a. The write data registers 360b to 360d associated with the blocks B to D, respectively, also perform similar operation.

The block A-associated write data register 361a latches the write data output from the block A-associated write data register 360a, and outputs the latched write data to the block A-associated write data register 362a. The write data registers 361b to 361d associated with the blocks B to D, respectively, also perform similar operation.

The block A-associated write data register 362a latches the write data output from the block A-associated write data register 361a, and outputs the latched write data to the individual banks. The write data registers 362b to 362d associated with the blocks B to D, respectively, also perform similar operation.

In the following description, the expression "block x-associated" is omitted unless expressly specified and reference is made simply to the write data registers 360a to 360d, 361a to 361d, etc.

The latency counter 363 delays the address signals input from the address buffers 214 and 340 for the number of clock cycles corresponding to the write latency.

Operation of the above embodiment will be now described.

Figure 17:
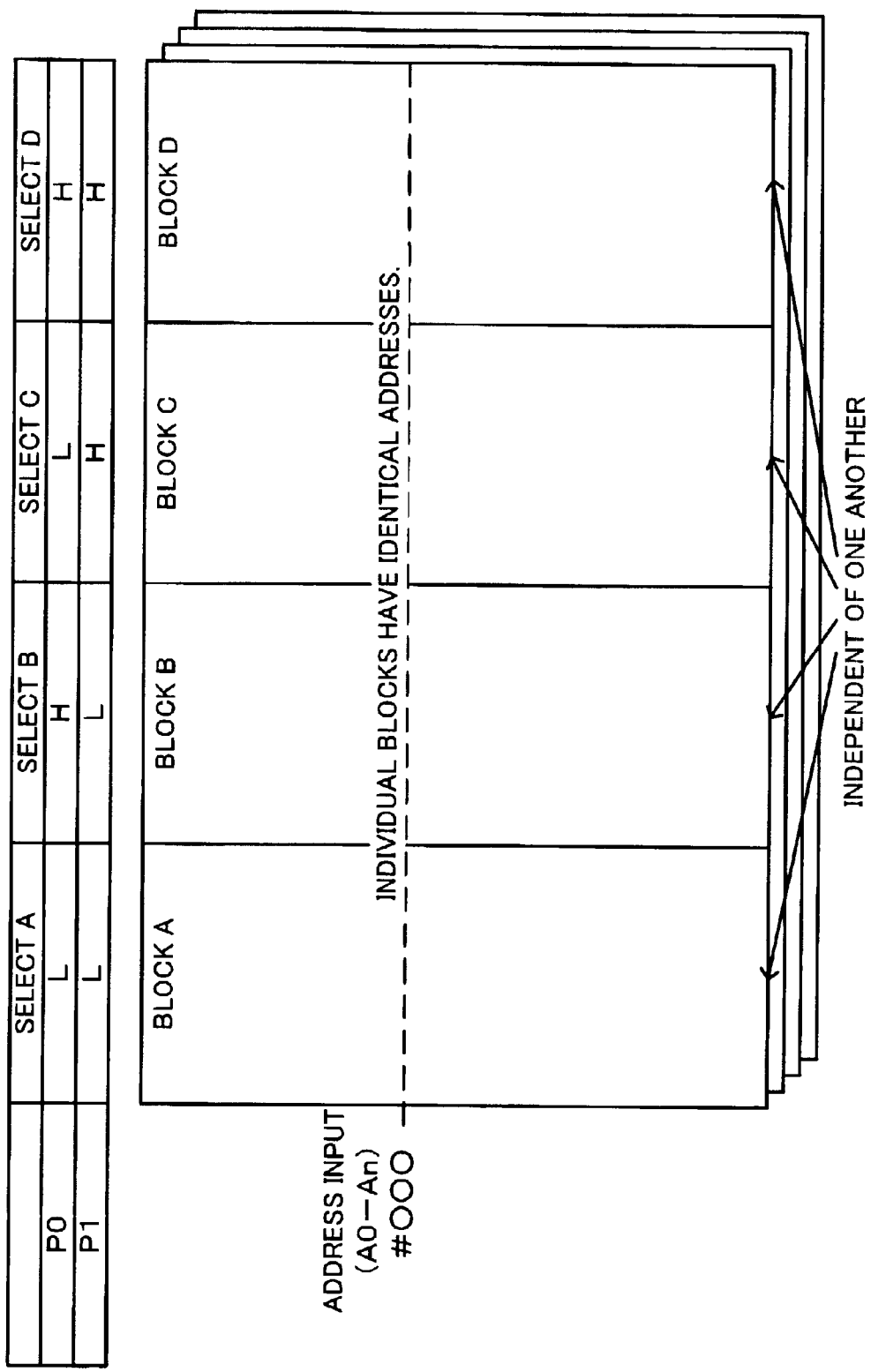
FIG. 17 is a diagram illustrating the relationship between address signals and memory blocks.

FIG. 17 shows the relationship between the address signals A0–An, P0, P1 and the blocks A to D. As shown in the figure, in the fourth embodiment, each of the memory banks BANK0 to BANK3 is divided into four blocks A to D having identical addresses assigned thereto. The address signal A0-An specifies a predetermined storage area of the individual blocks, while the address signal P0, P1 is used to select one of the blocks A to D, as shown in the upper part of FIG. 17. If P0 and P1 are both "L", for example, the block A is selected.

Figure 18:
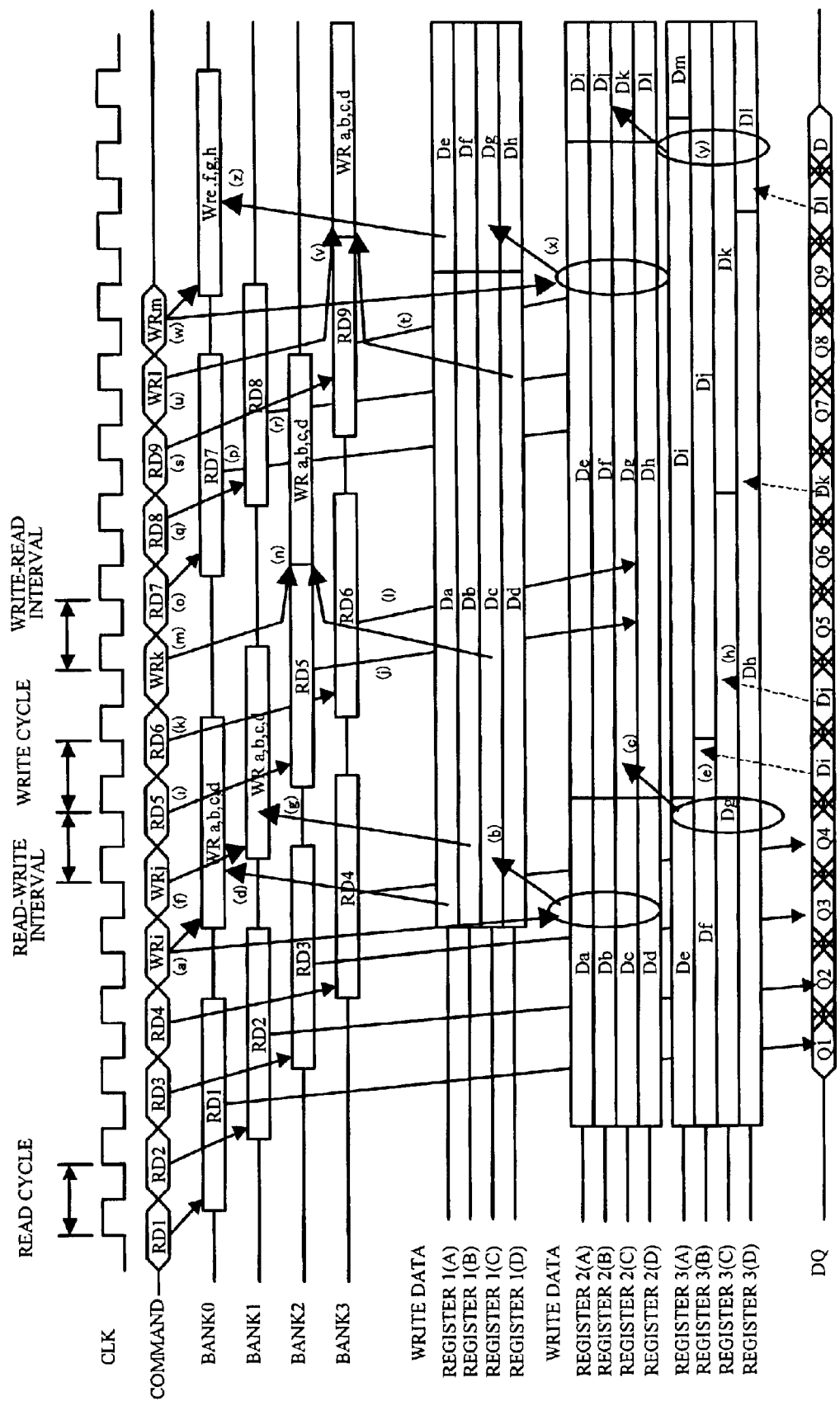
FIG. 18 is a timing chart illustrating operation according to the fourth embodiment.

FIG. 18 is a timing chart illustrating operation according to the fourth embodiment of the present invention. Referring to the figure, the operation according to this embodiment will be described. FIG. 18 illustrates an exemplary operation wherein read and write commands are sequentially supplied in order of read commands RD1 to RD4, write commands WRi and WRj, read commands RD5 and RD6, a write command WRk, read commands RD7 to RD9, and write commands WRl and WRm. It is also assumed that prior to the input of the read commands RD1 to RD4, eight write commands were input and data Da to Dd and De to Dh, corresponding to the respective write commands, have been stored in the registers 361a to 361d and 360a to 360d, respectively. In FIG. 18, the write data registers 362a to 362d are indicated as registers 1(A) to 1(D), the write data registers 361a to 361d as registers 2(A) to 2(D), and the write data registers 360a to 360d as registers 3(A) to 3(D), respectively.

Read operations performed in response to the read commands RD1 to RD4 are identical with those explained above with reference to FIG. 12, and therefore, description thereof is omitted.

The DRAM of this embodiment has the late write function like the device shown in FIG. 13. It is therefore possible to set the timing for supplying the write command WRi independently of the timing for supplying write data Di. Thus, the write command WRi can be supplied in synchronism with a clock signal CLK pulse immediately after the supply of the read command RD4 ((a) in FIG. 18). Namely, in this embodiment, the READ-WRITE command interval (timing specification) from the supply of the read command RD4 to the supply of the write command WRi is one clock cycle. The read cycle also is one clock cycle, as in the second and third embodiments. The following description is based on the assumption that at the time when the read command RD4 is input, the read and write shift registers of the bank selection circuit 220 are both selecting the memory bank BANK3.

Upon input of the write command WRi, the bank selection circuit 220 increments the write shift register therein, so that the memory bank BANK0 is selected. At this time, all of the registers 361a to 361d have data stored therein; accordingly, the data stored in the registers 361a to 361d are moved to the registers 362a to 362d, respectively ((b) in FIG. 18).

Also, the data stored in the data registers 360a to 360d are similarly moved to the data registers 361a to 361d, respectively.

The data moved to the registers 362a to 362d are written into the respective blocks A to D of the memory bank BANK0 ((d) in FIG. 18). Also, the write data Di associated with the write command WRi is stored in the register 360b ((e) in FIG. 18).

Subsequently, the write command WRj is input ((f) in FIG. 18), whereupon the bank selection circuit 220 increments the write shift register, so that the memory bank BANK1 is selected and the data stored in the registers 362a to 362d are written into the blocks A to D, respectively ((g) in FIG. 18). Also, the write data Dj associated with the write command WRj is stored in the register 360c ((h) in FIG. 18).

Then, the read command RD5 is input ((i) in FIG. 18), and thus the value of the read shift register of the bank selection circuit 220 is incremented and becomes "0". However, since the memory bank BANK0 is then performing write operation, the value of the read shift register is again incremented and becomes "1". Since the memory bank BANK1 also is then performing write operation, however, the read shift register is again incremented and data is read from the memory bank BANK2 which is then not performing write operation ((j) in FIG. 18).

Subsequently, the read command RD6 is input ((k) in FIG. 18), whereupon the value of the read shift register in the bank selection circuit 220 is incremented and becomes "3", so that data is read from the memory bank BANK3 ((l) in FIG. 18).

Then, the write command WRk is input ((m) in FIG. 18), and thus the value of the write shift register in the bank selection circuit 220 is incremented and becomes "2". However, since the memory bank BANK2 is then performing read operation in response to the read command RD5, write operation is executed on completion of the read operation ((n) in FIG. 18).

Subsequently, the read command RD7 is input ((o) in FIG. 18), and thus the value of the read shift register in the bank selection circuit 220 is incremented and becomes "0", so that data is read from the memory bank BANK0 ((p) in FIG. 18).

The read command RD8 is then input ((q) in FIG. 18), whereupon the value of the read shift register in the bank selection circuit 220 is incremented and becomes "1", and accordingly, data is read from the memory bank BANK1 ((r) in FIG. 18).

Then, the read command RD9 is input ((s) in FIG. 18), and thus the value of the read shift register in the bank selection circuit 220 is incremented and becomes "2". However, since the memory bank BANK2 is then performing write operation in response to WRk, the value of the read shift register is again incremented and data is read from the memory bank BANK3 ((t) in FIG. 18).

Subsequently, the write command WRl is input ((u) in FIG. 18), whereupon the value of the write shift register in the bank selection circuit 220 is incremented and becomes "3". However, the memory bank BANK3 is then performing read operation in response to the read command RD9, and accordingly, write operation is executed on completion of the read operation ((v) in FIG. 18).

The write command WRm is then input ((w) in FIG. 18), whereupon the data stored in the registers 361a to 361d are moved to the registers 62a to 62d, respectively ((x) in FIG. 18).

Similarly, the data stored in the data registers 360a to 360d are moved to the data registers 361a to 361d, respectively ((y) in FIG. 18).

The data moved to the registers 362a to 362d are written into the respective blocks A to D of the memory bank BANK0 ((z) in FIG. 18).

Figure 19A:
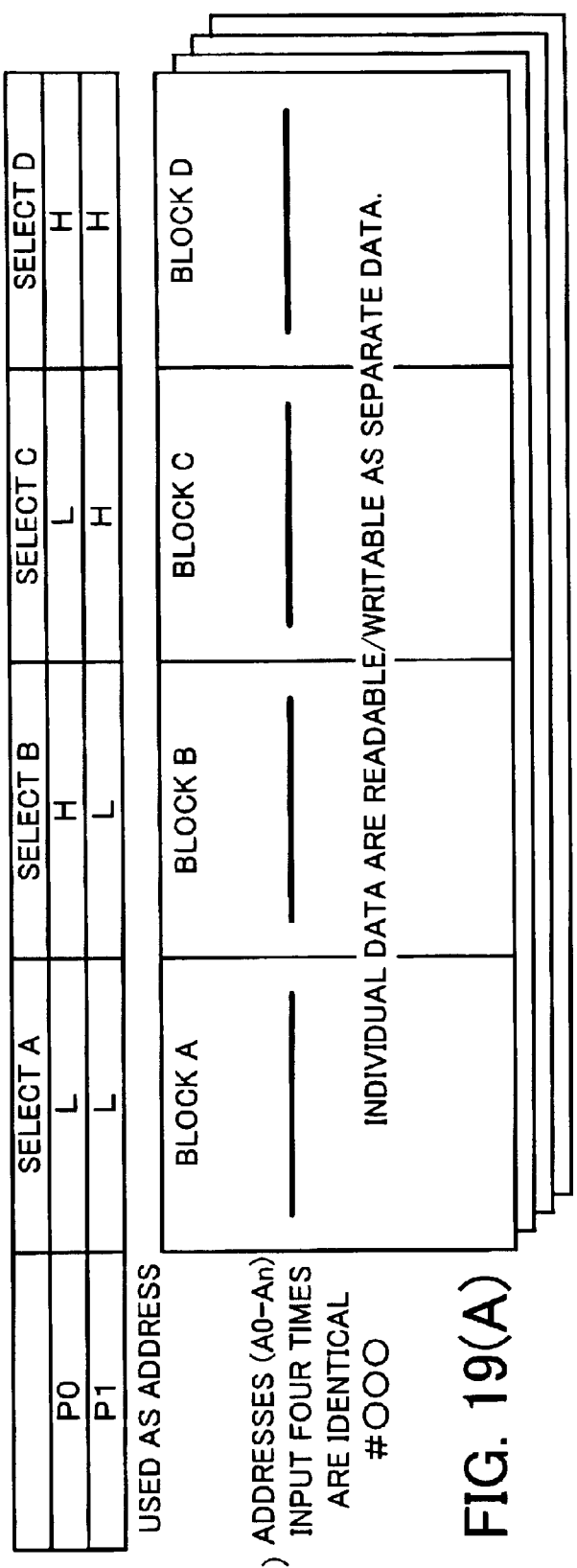
FIGS. 19(A), 19(B) is a diagram illustrating the relationship between the address signal P0 and P1 and the blocks according to the fourth embodiment.

FIG. 19 shows the relationship between the address signals P0, P1 and the blocks in the fourth embodiment, wherein FIG. 19(A) illustrates the case where addresses (A0–An) input four times along with write commands are the same (#○○○). Thus, where the addresses input four times are the same, respective data are stored in corresponding regions of the individual blocks, and the stored data can be read out or written as separate data independently of one another.

Figure 19B:
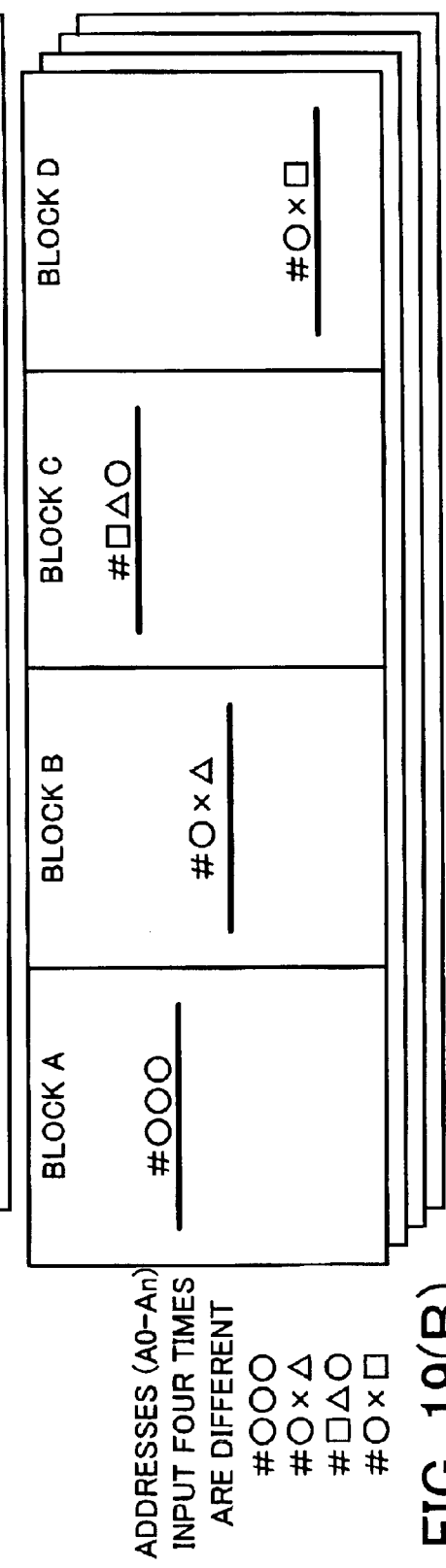

FIG. 19(B) illustrates the case where the addresses input four times are not the same (#○○○, #○×∆, #□∆○, #○×□). In this case, data are stored in respective different locations of the individual blocks.

As described above, this embodiment also provides advantages similar to those achieved by the second embodiment.

Further, in this embodiment, the registers hold the write data until the write data is written into all memory cells (for a period corresponding to four write commands), and comparison of addresses is made so that write data which is not yet written into the memory cells may be read from the registers and that already written data may be read from the memory cells, whereby the WRITE-READ command interval can be shortened.

With this method, however, a problem arises in that the write data keeps accumulating in the registers. Accordingly, multiple address data (in this embodiment, data corresponding to four commands) are written collectively, thereby solving the problem. Specifically, the fourth embodiment is configured such that data which have been stored in association with the four write commands up to the immediately preceding one can be written in response to one write command.

Figure 20:
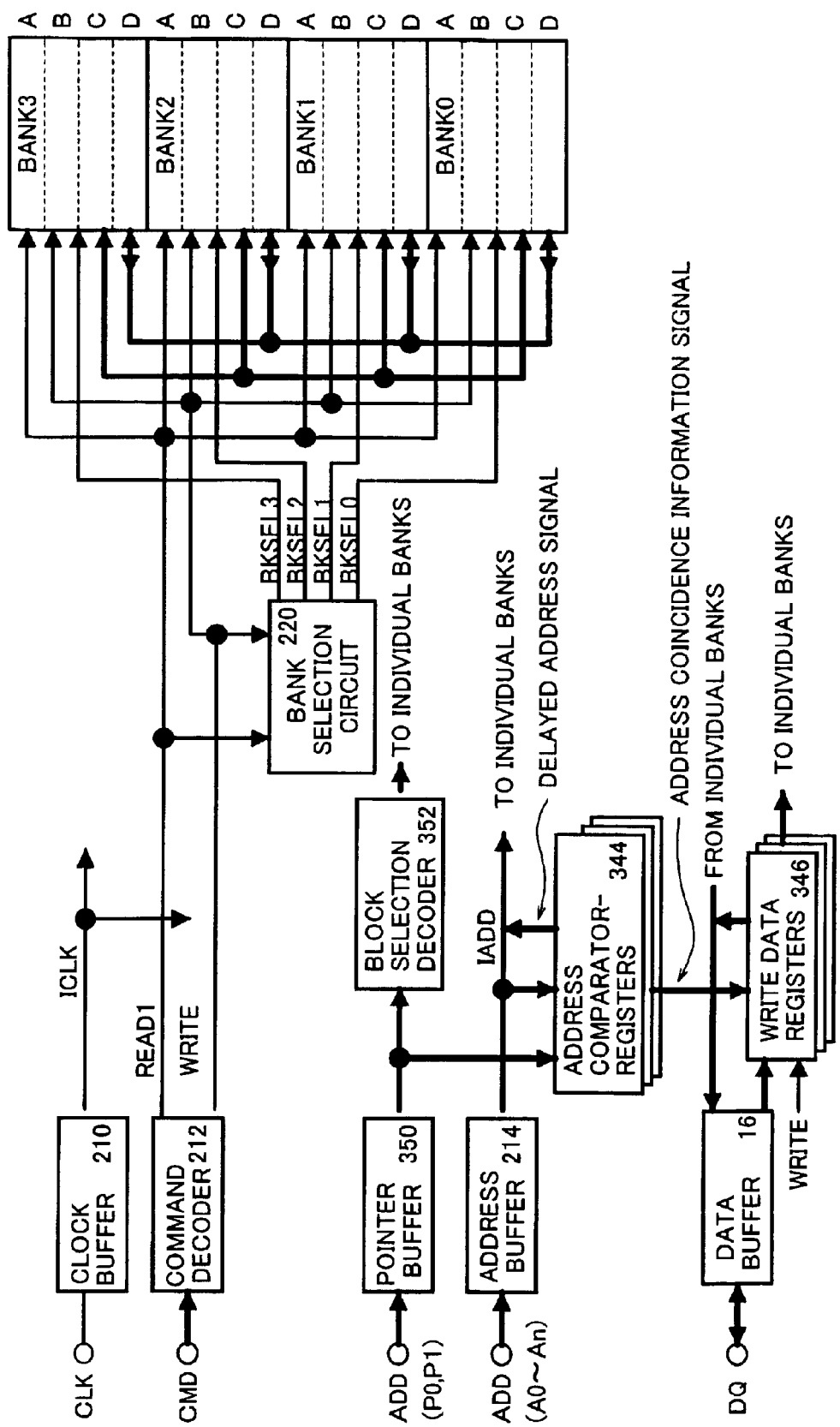
FIG. 20 is a block diagram illustrating a fifth embodiment.
Figures 22A, 22B, 22C:
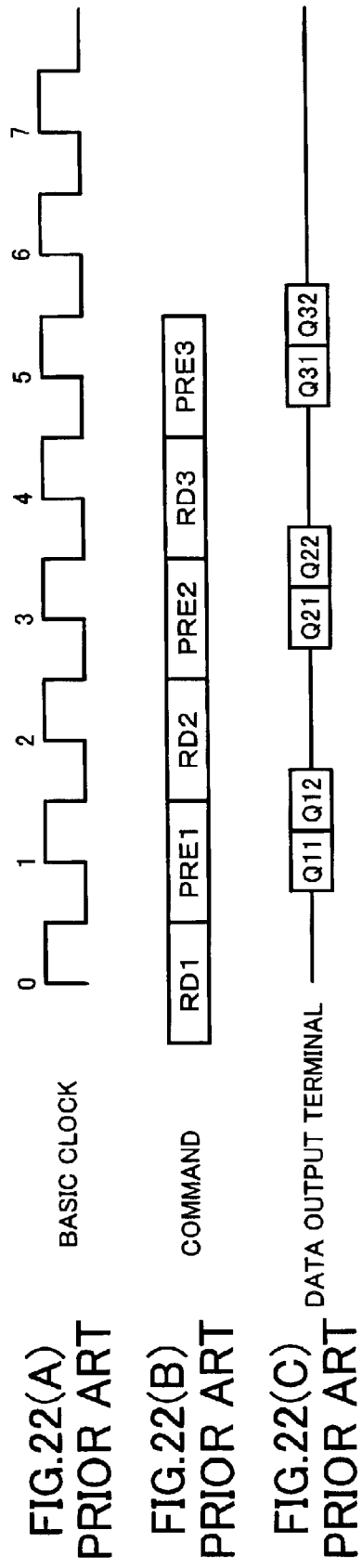
FIGS. 22(A), 22(B) and 22(C) are a timing chart illustrating an operation of a conventional semiconductor memory device.
Figures 24A, 24B, 24C:
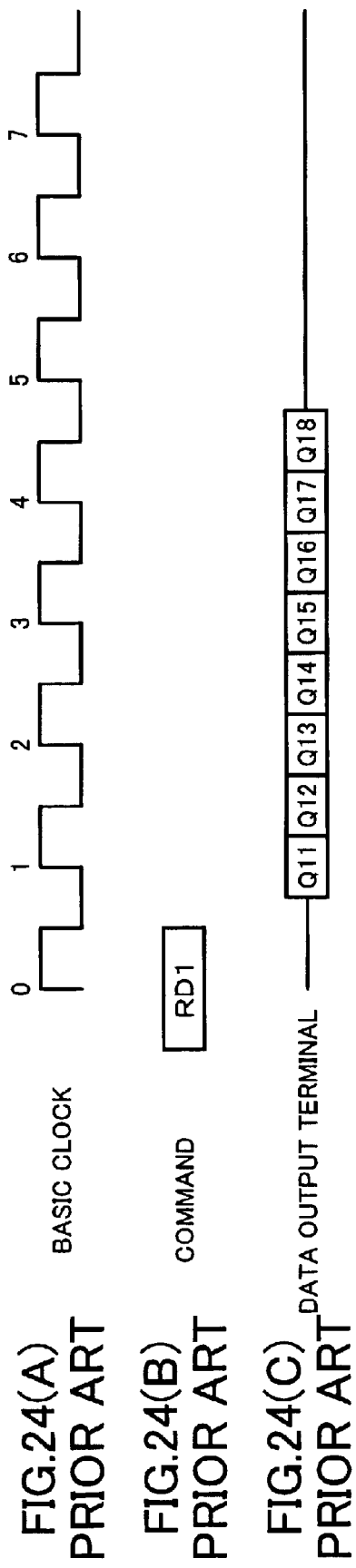
FIGS. 24(A), 24(B) and 24(C) are a timing chart illustrating an operation of still another conventional semiconductor memory device.

An exemplary configuration according to a fifth embodiment of the present invention will be now described. FIG. 20 illustrates an example of configuration of the fifth embodiment, the fifth embodiment corresponding to claims 11, 12 and 14. Identical reference numerals and symbols are used to denote circuits and signals identical with those explained above in relation to the fourth embodiment, and detailed description of such circuits and signals is omitted.

In the fourth embodiment, the address buffer 340 and the block selection decoder 342 of the fourth embodiment are replaced respectively by a pointer buffer 350 and a block selection decoder 352. In other respects, the fourth embodiment is configured in the same manner as the fourth embodiment.

The pointer buffer 350 receives the address signal P0, P1 as a pointer, and not as an address, and outputs the received address signal to the block selection decoder 352. The block selection decoder 352 decodes the address signal P0, P1 supplied from the pointer buffer 350, then generates a signal for selecting a corresponding block, and supplies the generated signal to the individual memory banks.

Operation of the above embodiment will be now described. FIG. 21 shows the pointer-address relationship according to the fifth embodiment.

In the fifth embodiment of the present invention, the pointer specifies a writing block, and as shown in the upper part of FIG. 21, one of the blocks A to D is selected in accordance with the state of the address signal P0, P1. In this embodiment, the pointer specifies a writing block and does not specify an address, unlike the fourth embodiment.

Accordingly, in the case where addresses input four times are the same as shown in FIG. 21(A), data are stored in the same address of the individual blocks. Namely, the blocks are used as if there are four storage locations with the same address.

On the other hand, where the addresses input four times are different from one another, data are stored at respective different addresses of the individual blocks, as shown in FIG. 21(B).

At the time of read operation, the pointer need not be incremented and a randomly generated address signal may be input, thus enabling random access.

In other respects, the operation of the fifth embodiment is identical with that of the fourth embodiment, and therefore, description thereof is omitted.

The fifth embodiment also provides advantages similar to those achieved by the second embodiment described above.

Also, the fifth embodiment provides the advantage that the WRITE-READ command interval as well as the WRITE-WRITE command interval can be shortened, as in the fourth embodiment.

Further, since the address signals P0, P1 are used as the pointer, random access is available, unlike the fouth embodiment. Specifically, in the fifth embodiment, at the time of writing data into a memory bank, the address signals P0, P1 need to be incremented to write the data into all of the blocks A to D. Thus, if P0, P1 also are included in the address space, data cannot be written without incrementing P0, P1. However, in the fifth embodiment, P0, P1 are not included in the address space but is used as the pointer, and accordingly, the above restriction does not exist, making it possible to write data randomly.

In the above embodiments, the present invention is applied to clock synchronization type DRAM, by way of example. The application of the present invention is, however, not limited to such DRAM alone, and the invention may be applied to clock synchronization type SRAM, for example. SRAM originally has good random accessibility, but by applying the present invention, it is possible to further enhance the data transfer rate.

In the foregoing description of the embodiments, the present invention is applied, by way of example, to DRAM in which read operation and write operation are performed in response to read and write commands, respectively, but the application of the present invention is not limited to such DRAM alone. For example, the present invention may be applied to DRAM in which a memory bank is activated by an active command and read/write operation is performed in response to a read/write command supplied thereafter.

Although the fourth and fifth embodiments are described on the assumption that the number of data items to be written at a time is four, the present invention is not limited to such application alone and the number of data items to be written at a time may be two, three, or more than four.

While the present invention has been described in detail, it is to be noted that the above embodiments and their modifications are only illustrative of the present invention and that the invention is not limited to those alone. Obviously the present invention may be modified in various ways without departing from the scope and spirit thereof.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having n (n>1) banks, comprising:
   an address input circuit for receiving an input address;
   a readout circuit for sequentially reading, from m (m≦n) banks, data corresponding to one address input via the address input circuit; and a data output circuit for outputting the data read by the readout circuit from the m banks to outside as collective data.

2. The semiconductor memory device according to claim 1, wherein the readout circuit reads data from the m banks sequentially at predetermined intervals of time such that congestion of data does not occur.

3. The semiconductor memory device according to claim 1, further comprising an output data quantity setting circuit for setting a quantity of data to be output from the data output circuit, and wherein the readout circuit sequentially reads data from a number of banks corresponding to the data quantity set by the output data quantity setting circuit.

4. The semiconductor memory device according to claim 1, further comprising an auto-precharge circuit for automatically precharging each of the banks after access to the each bank is ended.

5. An information processing system including a semiconductor memory device having n (n>1) banks, and a control device for controlling the semiconductor memory device, wherein the semiconductor memory device comprises:

an address input circuit for receiving an input address;

a readout circuit for sequentially reading, from m (m≦n) banks, data corresponding to one address input via the address input circuit; and a data output circuit for outputting the data read by the readout circuit from the m banks to outside as collective data, and the control device comprises:

a control circuit for controlling the semiconductor memory device in accordance with a cycle time determined by a read cycle of the readout circuit; and an access inhibit circuit for inhibiting access to a predetermined bank in accordance with the bank from which data is being read by the readout circuit.

6. A semiconductor memory device comprising:

a plurality of memory banks having identical addresses assigned thereto, identical data being written into the memory banks in response to a write command; and a bank selection circuit for selecting one of the memory banks in response to a read command, and for sequentially selecting the memory banks in response to the write command such that the memory banks individually start a write operation in a staggered manner.

7. The semiconductor memory device according to claim 6, wherein the bank selection circuit includes a shift register for sequentially activating bank selection signals for selecting the respective memory banks, in synchronism with the read command and the write command.

8. The semiconductor memory device according to claim 7, further comprising a write timing generator circuit for generating a write timing signal for executing the write operation, in response to the write command a number of times corresponding to the number of the memory banks, and wherein during the write operation, the bank selection circuit sequentially activates the bank selection signals in synchronism with the write timing signal.

9. The semiconductor memory device according to claim 6, further comprising a data register for holding write data supplied in association with the write command, and wherein the write data associated with a preceding write command and held by the data register is written into the memory banks in response to the write command.

10. The semiconductor memory device according to claim 9, further comprising:

an address register for holding a write address supplied in association with the write command;

an address comparator circuit for comparing, during the read operation, a read address supplied in association with the read command with the write address held by the address register, and outputting a coincidence signal if the read address coincides with the write address; and a data switching circuit, responsive to reception of the coincidence signal, for outputting, as readout data, the write data held by the data register.

11. The semiconductor memory device according to claim 10, wherein the data register and the address register respectively store a plurality of write data and write addresses corresponding to a plurality of write commands, and the plurality of write data held by the data register are written into the memory banks in response to the write command.

12. The semiconductor memory device according to claim 11, wherein the memory banks are each divided into a plurality of blocks, and the data corresponding to the plurality of write commands are written into the respective blocks in response to the write command.

13. The semiconductor memory device according to claim 12, wherein when the data are written by a write circuit, the blocks are specified by address data or a pointer.

14. The semiconductor memory device according to claim 11, wherein, if one of the memory banks from which data is to be read out is performing write operation, the data is read from a different one of the memory banks.

15. The semiconductor memory device according to claim 11, wherein, if one of the memory banks into which data is to be written is performing read operation, the data is written after completion of the read operation.

* * * * *